US007737724B2

(12) United States Patent
Snyder et al.

(10) Patent No.: US 7,737,724 B2
(45) Date of Patent: Jun. 15, 2010

(54) UNIVERSAL DIGITAL BLOCK INTERCONNECTION AND CHANNEL ROUTING

(75) Inventors: Warren Snyder, Snohomish, WA (US);
Bert Sullam, Bellevue, WA (US);
Haneef Mohammed, Beaverton, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/965,291

(22) Filed: Dec. 27, 2007

(65) Prior Publication Data

US 2008/0258759 A1    Oct. 23, 2008

Related U.S. Application Data

(60) Provisional application No. 60/912,399, filed on Apr. 17, 2007.

(51) Int. Cl.
*H01L 25/00* (2006.01)
*H03K 19/177* (2006.01)
(52) U.S. Cl. ............................... 326/41; 326/38; 326/39
(58) Field of Classification Search ............. 326/38–41, 326/47
See application file for complete search history.

(56) References Cited

U.S. PATENT DOCUMENTS

| | | | |
|---|---|---|---|
| 3,725,804 A | 4/1973 | Langan |
| 3,740,588 A | 6/1973 | Stratton et al. |
| 3,810,036 A | 5/1974 | Bloedom |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,438,404 A | 3/1984 | Philipp |
| 4,475,151 A | 10/1984 | Philipp |
| 4,497,575 A | 2/1985 | Philipp |
| 4,608,502 A | 8/1986 | Dijkmans et al. |

(Continued)

FOREIGN PATENT DOCUMENTS

DE        19710829 A1    9/1998

(Continued)

OTHER PUBLICATIONS

United States Patent and Trademark Office; PCT International Search Report; Aug. 15, 2008; 2 Pages.

(Continued)

*Primary Examiner*—Anh Q Tran

(57) ABSTRACT

A programmable routing scheme provides improved connectivity both between Universal Digital Blocks (UDBs) and between the UDBs and other micro-controller elements, peripherals and external Inputs and Outputs (I/Os) in the same Integrated Circuit (IC). The routing scheme increases the number of functions, flexibility, and the overall routing efficiency for programmable architectures. The UDBs can be grouped in pairs and share associated horizontal routing channels. Bidirectional horizontal and vertical segmentation elements extend routing both horizontally and vertically between different UDB pairs and to the other peripherals and I/O.

16 Claims, 9 Drawing Sheets

U.S. PATENT DOCUMENTS

| | | |
|---|---|---|
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,809,345 A | 2/1989 | Tabata et al. |
| 4,812,684 A | 3/1989 | Yamagiwa et al. |
| 4,827,401 A | 5/1989 | Hrustich et al. |
| 4,833,418 A | 5/1989 | Quintus et al. |
| 4,868,525 A | 9/1989 | Dias |
| 4,876,534 A | 10/1989 | Mead et al. |
| 4,878,200 A | 10/1989 | Asghar et al. |
| 4,879,461 A | 11/1989 | Philipp |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,336,936 A | 8/1994 | Allen et al. |
| 5,339,213 A | 8/1994 | O'Callaghan |
| 5,339,262 A | 8/1994 | Rostoker et al. |
| 5,341,267 A | 8/1994 | Whitten |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Lewis et al. |
| 5,371,860 A | 12/1994 | Mura et al. |
| 5,371,878 A | 12/1994 | Coker |
| 5,374,787 A | 12/1994 | Miller et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |
| 5,426,384 A | 6/1995 | May |
| 5,428,319 A | 6/1995 | Marvin et al. |
| 5,430,395 A | 7/1995 | Ichimaru |

| | | | | | |
|---|---|---|---|---|---|
| 5,430,687 A | 7/1995 | Hung et al. | 5,630,102 A | 5/1997 | Johnson et al. |
| 5,430,734 A | 7/1995 | Gilson | 5,631,577 A | 5/1997 | Freidin et al. |
| 5,432,476 A | 7/1995 | Tran | 5,633,766 A | 5/1997 | Hase et al. |
| 5,438,672 A | 8/1995 | Dey | 5,642,295 A | 6/1997 | Smayling |
| 5,440,305 A | 8/1995 | Signore et al. | 5,646,544 A | 7/1997 | Iadanza |
| 5,451,887 A | 9/1995 | El-Avat et al. | 5,646,901 A | 7/1997 | Sharpe-Geisler et al. |
| 5,455,525 A | 10/1995 | Ho et al. | 5,648,642 A | 7/1997 | Miller et al. |
| 5,455,731 A | 10/1995 | Parkinson | 5,663,900 A | 9/1997 | Bhandari et al. |
| 5,455,927 A | 10/1995 | Huang | 5,663,965 A | 9/1997 | Seymour |
| 5,457,410 A | 10/1995 | Ting | 5,664,199 A | 9/1997 | Kuwahara |
| 5,457,479 A | 10/1995 | Cheng | 5,670,915 A | 9/1997 | Cooper et al. |
| 5,463,591 A | 10/1995 | Aimoto et al. | 5,673,198 A | 9/1997 | Lawman et al. |
| 5,479,603 A | 12/1995 | Stone et al. | 5,675,825 A | 10/1997 | Dreyer et al. |
| 5,479,643 A | 12/1995 | Bhaskar et al. | 5,677,691 A | 10/1997 | Hosticka et al. |
| 5,479,652 A | 12/1995 | Dreyer et al. | 5,680,070 A | 10/1997 | Anderson et al. |
| 5,481,471 A | 1/1996 | Naglestad et al. | 5,682,032 A | 10/1997 | Philipp |
| 5,488,204 A | 1/1996 | Mead et al. | 5,684,434 A | 11/1997 | Mann et al. |
| 5,493,246 A | 2/1996 | Anderson | 5,684,952 A | 11/1997 | Stein |
| 5,493,723 A | 2/1996 | Beck et al. | 5,686,844 A | 11/1997 | Hull et al. |
| 5,495,077 A | 2/1996 | Miller et al. | 5,689,195 A | 11/1997 | Cliff et al. |
| 5,495,593 A | 2/1996 | Elmer et al. | 5,689,196 A | 11/1997 | Schutte |
| 5,495,594 A | 2/1996 | MacKenna et al. | 5,691,664 A | 11/1997 | Anderson et al. |
| 5,499,192 A | 3/1996 | Knapp et al. | 5,691,898 A | 11/1997 | Rosenberg et al. |
| 5,517,198 A | 5/1996 | McEwan | 5,694,063 A | 12/1997 | Burlison et al. |
| 5,519,854 A | 5/1996 | Watt | 5,696,952 A | 12/1997 | Pontarelli |
| 5,521,529 A | 5/1996 | Agrawal et al. | 5,699,024 A | 12/1997 | Manlove et al. |
| 5,530,444 A | 6/1996 | Tice et al. | 5,703,871 A | 12/1997 | Pope et al. |
| 5,530,673 A | 6/1996 | Tobita et al. | 5,706,453 A | 1/1998 | Cheng et al. |
| 5,530,813 A | 6/1996 | Paulsen et al. | 5,708,798 A | 1/1998 | Lynch et al. |
| 5,537,057 A | 7/1996 | Leong et al. | 5,710,906 A | 1/1998 | Ghosh et al. |
| 5,541,878 A | 7/1996 | LeMoncheck et al. | 5,712,969 A | 1/1998 | Zimmermann et al. |
| 5,543,588 A | 8/1996 | Bisset et al. | 5,724,009 A | 3/1998 | Collins et al. |
| 5,543,590 A | 8/1996 | Gillespie et al. | 5,727,170 A | 3/1998 | Mitchell et al. |
| 5,543,591 A | 8/1996 | Gillespie et al. | 5,729,704 A | 3/1998 | Stone et al. |
| 5,544,067 A | 8/1996 | Rostoker et al. | 5,730,165 A | 3/1998 | Philipp |
| 5,544,311 A | 8/1996 | Harenberg et al. | 5,732,277 A | 3/1998 | Kodosky et al. |
| 5,546,433 A | 8/1996 | Tran et al. | 5,734,272 A | 3/1998 | Belot et al. |
| 5,546,562 A | 8/1996 | Patel | 5,734,334 A | 3/1998 | Hsieh et al. |
| 5,552,725 A | 9/1996 | Ray et al. | 5,737,557 A | 4/1998 | Sullivan |
| 5,552,748 A | 9/1996 | O'Shaughnessy | 5,737,760 A | 4/1998 | Grimmer et al. |
| 5,554,951 A | 9/1996 | Gough | 5,745,011 A | 4/1998 | Scott |
| 5,555,452 A | 9/1996 | Callaway et al. | 5,748,048 A | 5/1998 | Moyal |
| 5,555,907 A | 9/1996 | Philipp | 5,748,875 A | 5/1998 | Tzori |
| 5,557,762 A | 9/1996 | Okuaki et al. | 5,752,013 A | 5/1998 | Christensen et al. |
| 5,559,502 A | 9/1996 | Schutte | 5,754,552 A | 5/1998 | Allmond et al. |
| 5,559,996 A | 9/1996 | Fujioka | 5,754,826 A | 5/1998 | Gamal et al. |
| 5,563,526 A | 10/1996 | Hastings et al. | 5,757,368 A | 5/1998 | Gerpheide et al. |
| 5,563,529 A | 10/1996 | Seltzer et al. | 5,758,058 A | 5/1998 | Milburn |
| 5,564,010 A | 10/1996 | Henry et al. | 5,761,128 A | 6/1998 | Watanabe |
| 5,564,108 A | 10/1996 | Hunsaker et al. | 5,763,909 A | 6/1998 | Mead et al. |
| 5,565,658 A | 10/1996 | Gerpheide et al. | 5,764,714 A | 6/1998 | Stansell et al. |
| 5,566,702 A | 10/1996 | Philipp | 5,767,457 A | 6/1998 | Gerpheide et al. |
| 5,572,665 A | 11/1996 | Nakabayashi | 5,774,704 A | 6/1998 | Williams |
| 5,572,719 A | 11/1996 | Biesterfeldt | 5,777,399 A | 7/1998 | Shibuya |
| 5,574,678 A | 11/1996 | Gorecki | 5,781,030 A | 7/1998 | Agrawal et al. |
| 5,574,852 A | 11/1996 | Bakker et al. | 5,781,747 A | 7/1998 | Kametani |
| 5,574,892 A | 11/1996 | Christensen | 5,784,545 A | 7/1998 | Anderson et al. |
| 5,579,353 A | 11/1996 | Parmenter et al. | 5,790,957 A | 8/1998 | Heidari |
| 5,587,945 A | 12/1996 | Lin et al. | 5,796,183 A | 8/1998 | Hourmand |
| 5,587,957 A | 12/1996 | Kowalczyk et al. | 5,799,176 A | 8/1998 | Kapusta et al. |
| 5,590,354 A | 12/1996 | Klapproth et al. | 5,802,073 A | 9/1998 | Platt |
| 5,594,388 A | 1/1997 | O'Shaughnessy et al. | 5,802,290 A | 9/1998 | Casselman |
| 5,594,734 A | 1/1997 | Worsley et al. | 5,805,792 A | 9/1998 | Swoboda et al. |
| 5,594,890 A | 1/1997 | Yamaura et al. | 5,805,897 A | 9/1998 | Glowny |
| 5,600,262 A | 2/1997 | Kolze | 5,808,883 A | 9/1998 | Hawkes |
| 5,604,466 A | 2/1997 | Dreps et al. | 5,811,987 A | 9/1998 | Ashmore, Jr. et al. |
| 5,608,892 A | 3/1997 | Wakerly | 5,812,698 A | 9/1998 | Platt et al. |
| 5,614,861 A | 3/1997 | Harada | 5,818,254 A | 10/1998 | Agrawal et al. |
| 5,625,316 A | 4/1997 | Chambers et al. | 5,818,444 A | 10/1998 | Alimpich et al. |
| 5,629,857 A | 5/1997 | Brennan | 5,819,028 A | 10/1998 | Manghirmalani et al. |
| 5,629,891 A | 5/1997 | LeMoncheck et al. | 5,822,387 A | 10/1998 | Mar |
| 5,630,052 A | 5/1997 | Shah | 5,822,531 A | 10/1998 | Gorczyca et al. |
| 5,630,057 A | 5/1997 | Hait | 5,828,693 A | 10/1998 | Mays et al. |

| Patent | Date | Inventor |
|---|---|---|
| 5,838,583 A | 11/1998 | Varadarajan et al. |
| 5,841,078 A | 11/1998 | Miller et al. |
| 5,841,996 A | 11/1998 | Nolan et al. |
| 5,844,256 A | 12/1998 | Mead et al. |
| 5,848,285 A | 12/1998 | Kapusta et al. |
| 5,850,156 A | 12/1998 | Wittman |
| 5,852,733 A | 12/1998 | Chien et al. |
| 5,854,625 A | 12/1998 | Frisch et al. |
| 5,857,109 A | 1/1999 | Taylor |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,867,046 A | 2/1999 | Sugasawa |
| 5,867,399 A | 2/1999 | Rostoker et al. |
| 5,869,979 A | 2/1999 | Bocchino |
| 5,870,004 A | 2/1999 | Lu |
| 5,870,309 A | 2/1999 | Lawman |
| 5,870,345 A | 2/1999 | Stecker |
| 5,872,464 A | 2/1999 | Gradinariu |
| 5,874,958 A | 2/1999 | Ludolph |
| 5,875,293 A | 2/1999 | Bell et al. |
| 5,877,656 A | 3/1999 | Mann et al. |
| 5,878,425 A | 3/1999 | Redpath |
| 5,880,411 A | 3/1999 | Gillespie et al. |
| 5,880,598 A | 3/1999 | Duong |
| 5,883,623 A | 3/1999 | Cseri |
| 5,886,582 A | 3/1999 | Stansell |
| 5,889,236 A | 3/1999 | Gillespie et al. |
| 5,889,723 A | 3/1999 | Pascucci |
| 5,889,936 A | 3/1999 | Chan |
| 5,889,988 A | 3/1999 | Held |
| 5,894,226 A | 4/1999 | Koyama |
| 5,894,243 A | 4/1999 | Hwang |
| 5,894,565 A | 4/1999 | Furtek et al. |
| 5,895,494 A | 4/1999 | Scalzi et al. |
| 5,896,068 A | 4/1999 | Moyal |
| 5,896,330 A | 4/1999 | Gibson |
| 5,898,345 A | 4/1999 | Namura et al. |
| 5,900,780 A | 5/1999 | Hirose et al. |
| 5,901,062 A | 5/1999 | Burch et al. |
| 5,903,718 A | 5/1999 | Marik |
| 5,905,398 A | 5/1999 | Todsen et al. |
| 5,911,059 A | 6/1999 | Profit, Jr. |
| 5,914,465 A | 6/1999 | Allen et al. |
| 5,914,633 A | 6/1999 | Comino et al. |
| 5,914,708 A | 6/1999 | LaGrange et al. |
| 5,920,310 A | 7/1999 | Faggin et al. |
| 5,923,264 A | 7/1999 | Lavelle et al. |
| 5,926,566 A | 7/1999 | Wang et al. |
| 5,929,710 A | 7/1999 | Bien |
| 5,930,150 A | 7/1999 | Cohen et al. |
| 5,933,023 A | 8/1999 | Young |
| 5,933,356 A | 8/1999 | Rostoker et al. |
| 5,933,816 A | 8/1999 | Zeanah et al. |
| 5,935,266 A | 8/1999 | Thurnhofer et al. |
| 5,939,904 A | 8/1999 | Fetterman et al. |
| 5,939,949 A | 8/1999 | Olgaard et al. |
| 5,941,991 A | 8/1999 | Kageshima |
| 5,942,733 A | 8/1999 | Allen et al. |
| 5,943,052 A | 8/1999 | Allen et al. |
| 5,945,878 A | 8/1999 | Westwick et al. |
| 5,949,632 A | 9/1999 | Barreras, Sr. et al. |
| 5,952,888 A | 9/1999 | Scott |
| 5,959,871 A | 9/1999 | Pierzchala et al. |
| 5,963,075 A | 10/1999 | Hiiragizawa |
| 5,963,105 A | 10/1999 | Nguyen |
| 5,963,503 A | 10/1999 | Lee |
| 5,964,893 A | 10/1999 | Circello et al. |
| 5,966,027 A | 10/1999 | Kapusta et al. |
| 5,966,532 A | 10/1999 | McDonald et al. |
| 5,968,135 A | 10/1999 | Teramoto et al. |
| 5,969,513 A | 10/1999 | Clark |
| 5,969,632 A | 10/1999 | Diamant et al. |
| 5,973,368 A | 10/1999 | Pearce et al. |
| 5,974,235 A | 10/1999 | Nunally et al. |
| 5,977,791 A | 11/1999 | Veenstra |
| 5,978,584 A | 11/1999 | Nishibata et al. |
| 5,978,937 A | 11/1999 | Miyamori et al. |
| 5,982,105 A | 11/1999 | Masters |
| 5,982,229 A | 11/1999 | Wong et al. |
| 5,982,241 A | 11/1999 | Nguyen et al. |
| 5,983,277 A | 11/1999 | Heile et al. |
| 5,986,479 A | 11/1999 | Mohan |
| 5,987,246 A | 11/1999 | Thomsen et al. |
| 5,988,902 A | 11/1999 | Holehan |
| 5,994,939 A | 11/1999 | Johnson et al. |
| 5,996,032 A | 11/1999 | Baker |
| 5,999,725 A | 12/1999 | Barbier et al. |
| 6,002,268 A * | 12/1999 | Sasaki et al. .................. 326/41 |
| 6,002,398 A | 12/1999 | Wilson |
| 6,003,054 A | 12/1999 | Oshima et al. |
| 6,003,133 A | 12/1999 | Moughanni et al. |
| 6,005,814 A | 12/1999 | Mulholland et al. |
| 6,005,904 A | 12/1999 | Knapp et al. |
| 6,008,685 A | 12/1999 | Kunst |
| 6,008,703 A | 12/1999 | Perrott et al. |
| 6,009,270 A | 12/1999 | Mann |
| 6,009,496 A | 12/1999 | Tsai |
| 6,011,407 A | 1/2000 | New |
| 6,012,835 A | 1/2000 | Thompson et al. |
| 6,014,135 A | 1/2000 | Fernandes |
| 6,014,509 A | 1/2000 | Furtek et al. |
| 6,016,554 A | 1/2000 | Skrovan et al. |
| 6,016,563 A | 1/2000 | Fleisher |
| 6,018,559 A | 1/2000 | Azegami et al. |
| 6,023,422 A | 2/2000 | Allen et al. |
| 6,023,565 A | 2/2000 | Lawman et al. |
| 6,026,134 A | 2/2000 | Duffy et al. |
| 6,026,501 A | 2/2000 | Hohl et al. |
| 6,028,271 A | 2/2000 | Gillespie et al. |
| 6,028,959 A | 2/2000 | Wang et al. |
| 6,031,365 A | 2/2000 | Sharpe-Geisler |
| 6,032,268 A | 2/2000 | Swoboda et al. |
| 6,034,538 A | 3/2000 | Abramovici |
| 6,037,807 A | 3/2000 | Wu et al. |
| 6,038,551 A | 3/2000 | Barlow et al. |
| 6,041,406 A | 3/2000 | Mann |
| 6,043,695 A | 3/2000 | O'Sullivan |
| 6,043,719 A | 3/2000 | Lin et al. |
| 6,049,223 A | 4/2000 | Lytle et al. |
| 6,049,225 A | 4/2000 | Huang et al. |
| 6,051,772 A | 4/2000 | Cameron et al. |
| 6,052,035 A | 4/2000 | Nolan et al. |
| 6,052,524 A | 4/2000 | Pauna |
| 6,057,705 A | 5/2000 | Wojewoda et al. |
| 6,058,263 A | 5/2000 | Voth |
| 6,058,452 A | 5/2000 | Rangasayee et al. |
| 6,061,511 A | 5/2000 | Marantz et al. |
| 6,066,961 A | 5/2000 | Lee et al. |
| 6,070,003 A | 5/2000 | Gove et al. |
| 6,072,803 A | 6/2000 | Allmond et al. |
| 6,075,941 A | 6/2000 | Itoh et al. |
| 6,079,985 A | 6/2000 | Wohl et al. |
| 6,081,140 A | 6/2000 | King |
| 6,094,730 A | 7/2000 | Lopez et al. |
| 6,097,211 A | 8/2000 | Couts-Martin et al. |
| 6,097,432 A | 8/2000 | Mead et al. |
| 6,101,457 A | 8/2000 | Barch et al. |
| 6,101,617 A | 8/2000 | Burckhartt et al. |
| 6,104,217 A | 8/2000 | Magana |
| 6,104,325 A | 8/2000 | Liaw et al. |
| 6,107,769 A | 8/2000 | Saylor et al. |
| 6,107,826 A | 8/2000 | Young et al. |
| 6,107,882 A | 8/2000 | Gabara et al. |
| 6,110,223 A | 8/2000 | Southgate et al. |

| | | | | | | |
|---|---|---|---|---|---|---|
| 6,111,431 | A | 8/2000 | Estrada | 6,239,798 B1 | 5/2001 | Ludolph et al. |
| 6,112,264 | A | 8/2000 | Beasley et al. | 6,240,375 B1 | 5/2001 | Sonoda |
| 6,121,791 | A | 9/2000 | Abbott | 6,246,258 B1 | 6/2001 | Lesea |
| 6,121,805 | A | 9/2000 | Thamsirianunt et al. | 6,246,410 B1 | 6/2001 | Bergeron et al. |
| 6,121,965 | A | 9/2000 | Kenney et al. | 6,249,167 B1 | 6/2001 | Oguchi et al. |
| 6,125,416 | A | 9/2000 | Warren | 6,249,447 B1 | 6/2001 | Boylan et al. |
| 6,130,548 | A | 10/2000 | Koifman | 6,253,754 B1 | 7/2001 | Roohparvar |
| 6,130,551 | A | 10/2000 | Agrawal et al. | 6,262,717 B1 | 7/2001 | Donohue et al. |
| 6,130,552 | A | 10/2000 | Jefferson et al. | 6,263,302 B1 | 7/2001 | Hellestrand et al. |
| 6,133,773 | A | 10/2000 | Garlepp et al. | 6,263,339 B1 | 7/2001 | Hirsch |
| 6,134,181 | A | 10/2000 | Landry | 6,263,484 B1 | 7/2001 | Yang |
| 6,134,516 | A | 10/2000 | Wang et al. | 6,271,679 B1 | 8/2001 | McClintock et al. |
| 6,137,308 | A | 10/2000 | Nayak | 6,275,117 B1 | 8/2001 | Abugharbieh et al. |
| 6,140,853 | A | 10/2000 | Lo | 6,278,568 B1 | 8/2001 | Cloke et al. |
| 6,141,376 | A | 10/2000 | Shaw | 6,280,391 B1 | 8/2001 | Olson et al. |
| 6,141,764 | A | 10/2000 | Ezell | 6,281,753 B1 | 8/2001 | Corsi et al. |
| 6,144,327 | A | 11/2000 | Distinti et al. | 6,282,547 B1 | 8/2001 | Hirsch |
| 6,148,104 | A | 11/2000 | Wang et al. | 6,282,551 B1 | 8/2001 | Anderson et al. |
| 6,148,441 | A | 11/2000 | Woodward | 6,286,127 B1 | 9/2001 | King et al. |
| 6,149,299 | A | 11/2000 | Aslan et al. | 6,288,707 B1 | 9/2001 | Philipp |
| 6,150,866 | A | 11/2000 | Eto et al. | 6,289,300 B1 | 9/2001 | Brannick et al. |
| 6,154,064 | A | 11/2000 | Proebsting | 6,289,478 B1 | 9/2001 | Kitagaki |
| 6,157,024 | A | 12/2000 | Chapdelaine et al. | 6,289,489 B1 | 9/2001 | Bold et al. |
| 6,157,270 | A | 12/2000 | Tso | 6,292,028 B1 | 9/2001 | Tomita |
| 6,161,199 | A | 12/2000 | Szeto et al. | 6,294,932 B1 | 9/2001 | Watarai |
| 6,166,367 | A | 12/2000 | Cho | 6,294,962 B1 | 9/2001 | Mar |
| 6,166,960 | A | 12/2000 | Marneweck et al. | 6,298,320 B1 | 10/2001 | Buckmaster et al. |
| 6,167,077 | A | 12/2000 | Ducaroir | 6,304,014 B1 | 10/2001 | England et al. |
| 6,167,559 | A | 12/2000 | Furtek et al. | 6,304,101 B1 | 10/2001 | Nishihara |
| 6,169,383 | B1 | 1/2001 | Sabin et al. | 6,304,790 B1 | 10/2001 | Nakamura et al. |
| 6,172,571 | B1 | 1/2001 | Moyal et al. | 6,307,413 B1 | 10/2001 | Dalmia et al. |
| 6,173,419 | B1 | 1/2001 | Barnett | 6,310,521 B1 | 10/2001 | Dalmia |
| 6,175,914 | B1 | 1/2001 | Mann | 6,310,611 B1 | 10/2001 | Caldwell |
| 6,175,949 | B1 | 1/2001 | Gristede et al. | 6,311,149 B1 | 10/2001 | Ryan et al. |
| 6,181,163 | B1 | 1/2001 | Agrawal et al. | 7,406,674 B1 | 10/2001 | Ogami et al. |
| 6,183,131 | B1 | 2/2001 | Holloway et al. | 6,314,530 B1 | 11/2001 | Mann |
| 6,185,127 | B1 | 2/2001 | Myers et al. | 6,320,184 B1 | 11/2001 | Winklhofer et al. |
| 6,185,450 | B1 | 2/2001 | Seguine et al. | 6,320,282 B1 | 11/2001 | Caldwell |
| 6,185,522 | B1 | 2/2001 | Bakker | 6,321,369 B1 | 11/2001 | Heile et al. |
| 6,185,703 | B1 | 2/2001 | Guddat et al. | 6,323,846 B1 | 11/2001 | Westerman et al. |
| 6,185,732 | B1 | 2/2001 | Mann et al. | 6,324,628 B1 | 11/2001 | Chan |
| 6,188,228 | B1 | 2/2001 | Philipp | 6,326,859 B1 | 12/2001 | Goldman et al. |
| 6,188,241 | B1 | 2/2001 | Gauthier et al. | 6,332,137 B1 | 12/2001 | Hori et al. |
| 6,188,381 | B1 | 2/2001 | van der Wal et al. | 6,332,201 B1 | 12/2001 | Chin et al. |
| 6,188,391 | B1 | 2/2001 | Seely et al. | 6,337,579 B1 | 1/2002 | Mochida |
| 6,188,975 | B1 | 2/2001 | Gay | 6,338,109 B1 | 1/2002 | Snyder et al. |
| 6,191,603 | B1 | 2/2001 | Muradali et al. | 6,339,815 B1 | 1/2002 | Feng et al. |
| 6,191,660 | B1 | 2/2001 | Mar et al. | 6,342,907 B1 | 1/2002 | Petty et al. |
| 6,191,998 | B1 | 2/2001 | Reddy et al. | 6,345,383 B1 | 2/2002 | Ueki |
| 6,192,431 | B1 | 2/2001 | Dabral et al. | 6,347,395 B1 | 2/2002 | Payne et al. |
| 6,198,303 | B1 | 3/2001 | Rangasayee | 6,351,789 B1 | 2/2002 | Green |
| 6,201,407 | B1 | 3/2001 | Kapusta et al. | 6,353,452 B1 | 3/2002 | Hamada et al. |
| 6,201,829 | B1 | 3/2001 | Schneider | 6,355,980 B1 | 3/2002 | Callahan |
| 6,202,044 | B1 | 3/2001 | Tzori | 6,356,862 B2 | 3/2002 | Bailey |
| 6,204,687 | B1 | 3/2001 | Schultz et al. | 6,356,958 B1 | 3/2002 | Lin |
| 6,205,574 | B1 | 3/2001 | Dellinger et al. | 6,356,960 B1 | 3/2002 | Jones et al. |
| 6,208,572 | B1 | 3/2001 | Adams et al. | 6,359,950 B2 | 3/2002 | Gossmann et al. |
| 6,211,708 | B1 | 4/2001 | Klemmer | 6,362,697 B1 | 3/2002 | Pulvirenti |
| 6,211,715 | B1 | 4/2001 | Terauchi | 6,366,174 B1 | 4/2002 | Berry et al. |
| 6,211,741 | B1 | 4/2001 | Dalmia | 6,366,300 B1 | 4/2002 | Ohara et al. |
| 6,215,352 | B1 | 4/2001 | Sudo | 6,366,874 B1 | 4/2002 | Lee et al. |
| 6,219,729 | B1 | 4/2001 | Keats et al. | 6,366,878 B1 | 4/2002 | Grunert |
| 6,222,528 | B1 | 4/2001 | Gerpheide et al. | 6,371,878 B1 | 4/2002 | Bowen |
| 6,223,144 | B1 | 4/2001 | Barnett et al. | 6,373,954 B1 | 4/2002 | Malcolm et al. |
| 6,223,147 | B1 | 4/2001 | Bowers | 6,374,370 B1 | 4/2002 | Bockhaus et al. |
| 6,223,272 | B1 | 4/2001 | Coehlo et al. | 6,377,009 B1 | 4/2002 | Philipp |
| RE37,195 | E | 5/2001 | Kean | 6,377,575 B1 | 4/2002 | Mullaney et al. |
| 6,225,866 | B1 | 5/2001 | Kubota et al. | 6,377,646 B1 | 4/2002 | Sha |
| 6,236,242 | B1 | 5/2001 | Hedberg | 6,380,811 B1 | 4/2002 | Zarubinsky et al. |
| 6,236,275 | B1 | 5/2001 | Dent | 6,380,929 B1 | 4/2002 | Platt |
| 6,236,278 | B1 | 5/2001 | Olgaard | 6,380,931 B1 | 4/2002 | Gillespie et al. |
| 6,236,593 | B1 | 5/2001 | Hong et al. | 6,384,947 B1 | 5/2002 | Ackerman et al. |
| 6,239,389 | B1 | 5/2001 | Allen et al. | 6,385,742 B1 | 5/2002 | Kirsch et al. |

| | | | |
|---|---|---|---|
| 6,388,109 B1 | 5/2002 | Shwarz et al. | |
| 6,388,464 B1 | 5/2002 | Lacey et al. | |
| 6,396,302 B2 | 5/2002 | New et al. | |
| 6,396,657 B1 | 5/2002 | Suzuki | |
| 6,397,232 B1 | 5/2002 | Cheng-Hung et al. | |
| 6,404,204 B1 | 6/2002 | Farruggia et al. | |
| 6,404,445 B1 | 6/2002 | Galea et al. | |
| 6,407,953 B1 | 6/2002 | Cleeves | |
| 6,408,432 B1 | 6/2002 | Herrmann et al. | |
| 6,411,665 B1 | 6/2002 | Chan et al. | |
| 6,411,974 B1 | 6/2002 | Graham et al. | |
| 6,414,671 B1 | 7/2002 | Gillespie et al. | |
| 6,421,698 B1 | 7/2002 | Hong | |
| 6,425,109 B1 | 7/2002 | Choukalos et al. | |
| 6,429,882 B1 | 8/2002 | Abdelnur et al. | |
| 6,430,305 B1 | 8/2002 | Decker | |
| 6,433,645 B1 | 8/2002 | Mann et al. | |
| 6,434,187 B1 | 8/2002 | Beard et al. | |
| 6,437,805 B1 | 8/2002 | Sojoodi et al. | |
| 6,438,565 B1 | 8/2002 | Ammirato et al. | |
| 6,438,735 B1 | 8/2002 | McElvain et al. | |
| 6,438,738 B1 | 8/2002 | Elayda | |
| 6,441,073 B1 | 8/2002 | Tanaka et al. | |
| 6,449,628 B1 | 9/2002 | Wasson | |
| 6,449,755 B1 | 9/2002 | Beausang et al. | |
| 6,452,437 B1 | 9/2002 | Takeuchi et al. | |
| 6,452,514 B1 | 9/2002 | Philipp | |
| 6,453,175 B2 | 9/2002 | Mizell et al. | |
| 6,453,461 B1 | 9/2002 | Chaiken | |
| 6,456,304 B1 | 9/2002 | Angiulo et al. | |
| 6,457,355 B1 | 10/2002 | Philipp | |
| 6,457,479 B1 | 10/2002 | Zhuang et al. | |
| 6,460,172 B1 | 10/2002 | Insenser Farre et al. | |
| 6,463,488 B1 | 10/2002 | San Juan | |
| 6,466,036 B1 | 10/2002 | Philipp | |
| 6,466,078 B1 | 10/2002 | Stiff | |
| 6,466,898 B1 | 10/2002 | Chan | |
| 6,473,069 B1 | 10/2002 | Gerpheide | |
| 6,477,691 B1 | 11/2002 | Bergamashi/Rab et al. | |
| 6,480,921 B1 | 11/2002 | Mansoorian et al. | |
| 6,483,343 B1 | 11/2002 | Faith et al. | |
| 6,487,700 B1 | 11/2002 | Fukushima | |
| 6,489,899 B1 | 12/2002 | Ely et al. | |
| 6,490,213 B1 | 12/2002 | Mu et al. | |
| 6,492,834 B1 | 12/2002 | Lytle et al. | |
| 6,498,720 B2 | 12/2002 | Glad | |
| 6,499,134 B1 | 12/2002 | Buffet et al. | |
| 6,499,359 B1 | 12/2002 | Washeleski et al. | |
| 6,504,403 B2 | 1/2003 | Bangs et al. | |
| 6,507,214 B1 | 1/2003 | Snyder | |
| 6,507,215 B1 | 1/2003 | Piasecki et al. | |
| 6,507,857 B1 | 1/2003 | Yalcinalp | |
| 6,509,758 B2 | 1/2003 | Piasecki et al. | |
| 6,512,395 B1 | 1/2003 | Lacey et al. | |
| 6,516,428 B2 | 2/2003 | Wenzel et al. | |
| 6,522,128 B1 | 2/2003 | Ely et al. | |
| 6,523,416 B2 | 2/2003 | Takagi et al. | |
| 6,525,593 B1 | 2/2003 | Mar | |
| 6,529,791 B1 | 3/2003 | Takagi | |
| 6,530,065 B1 | 3/2003 | McDonald et al. | |
| 6,534,970 B1 | 3/2003 | Ely et al. | |
| 6,535,200 B2 | 3/2003 | Philipp | |
| 6,535,946 B1 | 3/2003 | Bryant et al. | |
| 6,536,028 B1 | 3/2003 | Katsioulas et al. | |
| 6,539,534 B1 | 3/2003 | Bennett | |
| 6,542,025 B1 | 4/2003 | Kutz et al. | |
| 6,542,844 B1 | 4/2003 | Hanna | |
| 6,554,469 B1 | 4/2003 | Thomson et al. | |
| 6,557,164 B1 | 4/2003 | Faustini | |
| 6,559,685 B2 | 5/2003 | Green | |
| 6,560,306 B1 | 5/2003 | Duffy et al. | |
| 6,560,699 B1 | 5/2003 | Konkle | |
| 6,563,391 B1 | 5/2003 | Mar | |
| 6,564,179 B1 | 5/2003 | Belhaj | |
| 6,566,961 B2 | 5/2003 | Dasgupta et al. | |
| 6,567,426 B1 | 5/2003 | van Hook et al. | |
| 6,567,932 B2 | 5/2003 | Edwards et al. | |
| 6,570,557 B1 | 5/2003 | Westerman et al. | |
| 6,571,331 B2 | 5/2003 | Henry et al. | |
| 6,574,590 B1 | 6/2003 | Kershaw et al. | |
| 6,574,739 B1 | 6/2003 | Kung et al. | |
| 6,575,373 B1 | 6/2003 | Nakano | |
| 6,577,258 B2 | 6/2003 | Ruha et al. | |
| 6,578,174 B2 | 6/2003 | Zizzo | |
| 6,580,329 B2 | 6/2003 | Sander | |
| 6,581,191 B1 | 6/2003 | Schubert et al. | |
| 6,587,093 B1 | 7/2003 | Shaw et al. | |
| 6,587,995 B1 | 7/2003 | Duboc et al. | |
| 6,588,004 B1 | 7/2003 | Southgate et al. | |
| 6,590,422 B1 | 7/2003 | Dillon | |
| 6,590,517 B1 | 7/2003 | Swanson | |
| 6,591,369 B1 | 7/2003 | Edwards et al. | |
| 6,592,626 B1 | 7/2003 | Bauchot et al. | |
| 6,594,799 B1 | 7/2003 | Robertson et al. | |
| 6,597,212 B1 | 7/2003 | Wang et al. | |
| 6,597,824 B2 | 7/2003 | Newberg et al. | |
| 6,598,178 B1 | 7/2003 | Yee et al. | |
| 6,600,346 B1 | 7/2003 | Macaluso | |
| 6,600,351 B2 | 7/2003 | Bisanti et al. | |
| 6,600,575 B1 | 7/2003 | Kohara | |
| 6,601,189 B1 | 7/2003 | Edwards et al. | |
| 6,601,236 B1 | 7/2003 | Curtis | |
| 6,603,330 B1 | 8/2003 | Snyder | |
| 6,603,348 B1 | 8/2003 | Preuss et al. | |
| 6,604,179 B2 | 8/2003 | Volk et al. | |
| 6,606,731 B1 | 8/2003 | Baum et al. | |
| 6,608,472 B1 | 8/2003 | Kutz et al. | |
| 6,610,936 B2 | 8/2003 | Gillespie et al. | |
| 6,611,220 B1 | 8/2003 | Snyder | |
| 6,611,276 B1 | 8/2003 | Muratori et al. | |
| 6,611,856 B1 | 8/2003 | Liao et al. | |
| 6,611,952 B1 | 8/2003 | Prakash et al. | |
| 6,613,098 B1 | 9/2003 | Sorge et al. | |
| 6,614,260 B1 | 9/2003 | Welch et al. | |
| 6,614,320 B1 | 9/2003 | Sullam et al. | |
| 6,614,374 B1 | 9/2003 | Gustavsson et al. | |
| 6,614,458 B1 | 9/2003 | Lambert et al. | |
| 6,617,888 B2 | 9/2003 | Volk | |
| 6,618,854 B1 | 9/2003 | Mann | |
| 6,621,356 B2 | 9/2003 | Gotz et al. | |
| 6,624,640 B2 | 9/2003 | Lund et al. | |
| 6,625,765 B1 | 9/2003 | Krishnan | |
| 6,628,163 B2 | 9/2003 | Dathe et al. | |
| 6,631,508 B1 | 10/2003 | Williams | |
| 6,634,008 B1 | 10/2003 | Dole | |
| 6,636,096 B2 | 10/2003 | Schaffer et al. | |
| 6,637,015 B1 | 10/2003 | Ogami et al. | |
| 6,639,586 B2 | 10/2003 | Gerpheide | |
| 6,642,857 B1 | 11/2003 | Schediwy et al. | |
| 6,643,151 B1 | 11/2003 | Nebrigic et al. | |
| 6,643,810 B1 | 11/2003 | Whetsel | |
| 6,649,924 B1 | 11/2003 | Philipp et al. | |
| 6,650,581 B2 | 11/2003 | Hong et al. | |
| 6,658,498 B1 | 12/2003 | Carney et al. | |
| 6,658,633 B2 | 12/2003 | Devins et al. | |
| 6,661,288 B2 | 12/2003 | Morgan et al. | |
| 6,661,410 B2 | 12/2003 | Casebolt et al. | |
| 6,664,978 B1 | 12/2003 | Kekic et al. | |
| 6,664,991 B1 | 12/2003 | Chew et al. | |
| 6,667,740 B2 | 12/2003 | Ely et al. | |
| 6,670,852 B1 | 12/2003 | Hauck | |
| 6,673,308 B2 | 1/2004 | Hino et al. | |
| 6,677,814 B2 | 1/2004 | Low et al. | |
| 6,677,932 B1 | 1/2004 | Westerman | |
| 6,678,645 B1 | 1/2004 | Rajsuman et al. | |
| 6,678,877 B1 | 1/2004 | Perry et al. | |

| | | | | | | |
|---|---|---|---|---|---|---|
| 6,680,632 B1 | 1/2004 | Meyers et al. | | 6,825,869 B2 | 11/2004 | Bang |
| 6,680,731 B2 | 1/2004 | Gerpheide et al. | | 6,829,727 B1 | 12/2004 | Pawloski |
| 6,681,280 B1 | 1/2004 | Miyake et al. | | 6,836,169 B2 | 12/2004 | Richmond et al. |
| 6,681,359 B1 | 1/2004 | Au et al. | | 6,839,774 B1 | 1/2005 | Ahn et al. |
| 6,683,462 B2 | 1/2004 | Shimizu | | 6,842,710 B1 | 1/2005 | Gehring et al. |
| 6,683,930 B1 | 1/2004 | Dalmia | | 6,847,203 B1 | 1/2005 | Conti et al. |
| 6,686,787 B2 | 2/2004 | Ling | | 6,850,117 B2 | 2/2005 | Weber et al. |
| 6,686,860 B2 | 2/2004 | Gulati et al. | | 6,850,554 B1 | 2/2005 | Sha |
| 6,690,224 B1 | 2/2004 | Moore | | 6,853,598 B2 | 2/2005 | Chevallier |
| 6,691,301 B2 | 2/2004 | Bowen | | 6,854,067 B1 | 2/2005 | Kutz et al. |
| 6,697,754 B1 | 2/2004 | Alexander | | 6,856,433 B2 | 2/2005 | Hatano et al. |
| 6,701,340 B1 | 3/2004 | Gorecki | | 6,859,884 B1 | 2/2005 | Sullam |
| 6,701,487 B1 | 3/2004 | Ogami et al. | | 6,862,240 B2 | 3/2005 | Burgan |
| 6,701,508 B1 | 3/2004 | Bartz et al. | | 6,864,710 B1 | 3/2005 | Lacey et al. |
| 6,704,381 B1 | 3/2004 | Moyal et al. | | 6,865,429 B1 | 3/2005 | Schneider et al. |
| 6,704,879 B1 | 3/2004 | Parrish | | 6,865,504 B2 | 3/2005 | Larson et al. |
| 6,704,889 B2 | 3/2004 | Veenstra et al. | | 6,868,500 B1 | 3/2005 | Kutz et al. |
| 6,704,893 B1 | 3/2004 | Bauwens et al. | | 6,871,253 B2 | 3/2005 | Greeff et al. |
| 6,705,511 B1 | 3/2004 | Dames et al. | | 6,871,331 B1 | 3/2005 | Bloom et al. |
| 6,711,226 B1 | 3/2004 | Williams et al. | | 6,873,203 B1 | 3/2005 | Latham, II et al. |
| 6,711,731 B2 | 3/2004 | Weiss | | 6,873,210 B2 | 3/2005 | Mulder et al. |
| 6,713,897 B2 | 3/2004 | Caldwell | | 6,880,086 B2 | 4/2005 | Kidder et al. |
| 6,714,066 B2 | 3/2004 | Gorecki et al. | | 6,888,453 B2 | 5/2005 | Lutz et al. |
| 6,714,817 B2 | 3/2004 | Daynes et al. | | 6,888,538 B2 | 5/2005 | Ely et al. |
| 6,715,132 B1 | 3/2004 | Bartz et al. | | 6,892,310 B1 | 5/2005 | Kutz et al. |
| 6,717,474 B2 | 4/2004 | Chen et al. | | 6,892,322 B1 | 5/2005 | Snyder |
| 6,718,294 B1 | 4/2004 | Bortfeld | | 6,893,724 B2 | 5/2005 | Lin et al. |
| 6,718,520 B1 | 4/2004 | Merryman et al. | | 6,894,928 B2 | 5/2005 | Owen |
| 6,718,533 B1 | 4/2004 | Schneider et al. | | 6,897,390 B2 | 5/2005 | Caldwell et al. |
| 6,724,220 B1 | 4/2004 | Snyder et al. | | 6,898,703 B1 | 5/2005 | Ogami et al. |
| 6,728,900 B1 | 4/2004 | Meli | | 6,900,663 B1 | 5/2005 | Roper et al. |
| 6,728,902 B2 | 4/2004 | Kaiser et al. | | 6,901,563 B1 | 5/2005 | Ogami et al. |
| 6,730,863 B1 | 5/2004 | Gerpheide et al. | | 6,903,402 B2 | 6/2005 | Miyazawa |
| 6,731,552 B2 | 5/2004 | Perner | | 6,903,613 B1 | 6/2005 | Mitchell et al. |
| 6,732,068 B2 | 5/2004 | Sample et al. | | 6,904,570 B2 | 6/2005 | Foote et al. |
| 6,732,347 B1 | 5/2004 | Bixler et al. | | 6,910,126 B1 | 6/2005 | Mar et al. |
| 6,738,858 B1 | 5/2004 | Fernald et al. | | 6,911,857 B1 | 6/2005 | Stiff |
| 6,744,323 B1 | 6/2004 | Moyal et al. | | 6,917,661 B1 | 7/2005 | Scott et al. |
| 6,748,569 B1 | 6/2004 | Brooke et al. | | 6,922,821 B1 | 7/2005 | Nemecek |
| 6,750,852 B2 | 6/2004 | Gillespie et al. | | 6,924,668 B2 | 8/2005 | Muller et al. |
| 6,750,889 B1 | 6/2004 | Livingston et al. | | 6,934,674 B1 | 8/2005 | Douezy et al. |
| 6,754,765 B1 | 6/2004 | Chang et al. | | 6,937,075 B2 | 8/2005 | Lim et al. |
| 6,754,849 B2 | 6/2004 | Tamura | | 6,940,356 B2 | 9/2005 | McDonald et al. |
| 6,757,882 B2 | 6/2004 | Chen et al. | | 6,941,336 B1 | 9/2005 | Mar |
| 6,765,407 B1 | 7/2004 | Snyder | | 6,944,018 B2 | 9/2005 | Caldwell |
| 6,768,337 B2 | 7/2004 | Kohno et al. | | 6,949,811 B2 | 9/2005 | Miyazawa |
| 6,768,352 B1 | 7/2004 | Maher et al. | | 6,949,984 B2 | 9/2005 | Siniscalchi |
| 6,769,622 B1 | 8/2004 | Tournemille et al. | | 6,950,954 B1 | 9/2005 | Sullam et al. |
| 6,771,552 B2 | 8/2004 | Fujisawa | | 6,950,990 B2 | 9/2005 | Rajarajan et al. |
| 6,774,644 B2 | 8/2004 | Eberlein | | 6,952,778 B1 | 10/2005 | Snyder |
| 6,781,456 B2 | 8/2004 | Pradhan | | 6,954,511 B2 | 10/2005 | Tachimori |
| 6,782,068 B1 | 8/2004 | Wilson et al. | | 6,954,904 B2 | 10/2005 | White |
| 6,784,821 B1 | 8/2004 | Lee | | 6,956,419 B1 | 10/2005 | Mann et al. |
| 6,785,881 B1 | 8/2004 | Bartz et al. | | 6,957,180 B1 | 10/2005 | Nemecek |
| 6,788,116 B1 | 9/2004 | Cook et al. | | 6,957,242 B1 | 10/2005 | Snyder |
| 6,788,221 B1 | 9/2004 | Ely et al. | | 6,963,233 B2 | 11/2005 | Puccio et al. |
| 6,788,521 B2 | 9/2004 | Nishi | | 6,967,511 B1 | 11/2005 | Sullam |
| 6,791,377 B2 | 9/2004 | Iichmann et al. | | 6,967,960 B1 | 11/2005 | Bross et al. |
| 6,792,584 B1 | 9/2004 | Eneboe et al. | | 6,968,346 B2 | 11/2005 | Hekmatpour |
| 6,798,218 B2 | 9/2004 | Kasperkovitz | | 6,969,978 B2 | 11/2005 | Dening |
| 6,798,299 B1 | 9/2004 | Mar et al. | | 6,970,844 B1 | 11/2005 | Bierenbaum |
| 6,799,198 B1 | 9/2004 | Huboi et al. | | 6,973,400 B2 | 12/2005 | Cahill-O'Brien et al. |
| 6,806,771 B1 | 10/2004 | Hildebrant et al. | | 6,975,123 B1 | 12/2005 | Malang et al. |
| 6,806,782 B2 | 10/2004 | Motoyoshi et al. | | 6,980,060 B2 | 12/2005 | Boerstler et al. |
| 6,809,275 B1 | 10/2004 | Cheng et al. | | 6,981,090 B1 | 12/2005 | Kutz et al. |
| 6,809,566 B1 | 10/2004 | Xin-LeBlanc | | 6,988,192 B2 | 1/2006 | Snider |
| 6,810,442 B1 | 10/2004 | Lin et al. | | 6,996,799 B1 | 2/2006 | Cismas et al. |
| 6,815,979 B2 | 11/2004 | Ooshita | | 7,005,933 B1 | 2/2006 | Shutt |
| 6,816,544 B1 | 11/2004 | Bailey et al. | | 7,009,444 B1 | 3/2006 | Scott |
| 6,819,142 B2 | 11/2004 | Viehmann et al. | | 7,015,735 B2 | 3/2006 | Kimura et al. |
| 6,823,282 B1 | 11/2004 | Snyder | | 7,017,145 B2 | 3/2006 | Taylor |
| 6,823,497 B2 | 11/2004 | Schubert et al. | | 7,017,409 B2 | 3/2006 | Zielinski et al. |
| 6,825,689 B1 | 11/2004 | Snyder | | 7,020,854 B2 | 3/2006 | Killian et al. |

| | | |
|---|---|---|
| 7,023,215 B2 | 4/2006 | Seenwyk |
| 7,023,257 B1 | 4/2006 | Sullam |
| 7,024,636 B2 | 4/2006 | Weed |
| 7,024,654 B2 | 4/2006 | Bersch et al. |
| 7,026,861 B2 | 4/2006 | Seenwyk |
| 7,030,513 B2 | 4/2006 | Caldwell |
| 7,030,656 B2 | 4/2006 | Lo et al. |
| 7,030,688 B2 | 4/2006 | Dosho et al. |
| 7,030,782 B2 | 4/2006 | Ely et al. |
| 7,034,603 B2 | 4/2006 | Brady et al. |
| 7,042,301 B2 | 5/2006 | Sutardja |
| 7,047,166 B2 | 5/2006 | Dancea |
| 7,055,035 B2 | 5/2006 | Allison et al. |
| 7,058,921 B1 | 6/2006 | Hwang et al. |
| 7,073,158 B2 | 7/2006 | McCubbrey |
| 7,076,420 B1 | 7/2006 | Snyder et al. |
| 7,086,014 B1 | 8/2006 | Bartz et al. |
| 7,088,166 B1 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,098,414 B2 | 8/2006 | Caldwell |
| 7,099,818 B1 | 8/2006 | Nemecek |
| 7,103,108 B1 | 9/2006 | Beard |
| 7,109,978 B2 | 9/2006 | Gillespie et al. |
| 7,117,485 B2 | 10/2006 | Wilkinson et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,133,140 B2 | 11/2006 | Lukacs et al. |
| 7,133,793 B2 | 11/2006 | Ely et al. |
| 7,138,841 B1 | 11/2006 | Li |
| 7,138,868 B2 | 11/2006 | Sanchez et al. |
| 7,139,530 B2 | 11/2006 | Kusbel |
| 7,141,968 B2 | 11/2006 | Hibbs et al. |
| 7,141,987 B2 | 11/2006 | Hibbs et al. |
| 7,149,316 B1 | 12/2006 | Kutz et al. |
| 7,150,002 B1 | 12/2006 | Anderson et al. |
| 7,151,528 B2 | 12/2006 | Taylor et al. |
| 7,152,027 B2 | 12/2006 | Andrade et al. |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,171,455 B1 | 1/2007 | Gupta et al. |
| 7,176,701 B2 | 2/2007 | Wachi et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,200,507 B2 | 4/2007 | Chen et al. |
| 7,206,733 B1 | 4/2007 | Nemecek |
| 7,212,189 B2 | 5/2007 | Shaw et al |
| 7,221,187 B1 | 5/2007 | Snyder et al. |
| 7,227,389 B2 | 6/2007 | Gong et al. |
| 7,236,921 B1 | 6/2007 | Nemecek et al. |
| 7,250,825 B2 | 7/2007 | Wilson et al. |
| 7,256,588 B2 | 8/2007 | Howard et al. |
| 7,265,633 B1 | 9/2007 | Stiff |
| 7,266,768 B2 | 9/2007 | Ferlitsch et al. |
| 7,281,846 B2 | 10/2007 | McLeod |
| 7,282,905 B2 | 10/2007 | Chen et al. |
| 7,283,151 B2 | 10/2007 | Nihei et al. |
| 7,288,977 B2 | 10/2007 | Stanley |
| 7,298,124 B2 | 11/2007 | Kan et al. |
| 7,301,835 B2 | 11/2007 | Joshi et al. |
| 7,307,485 B1 | 12/2007 | Snyder et al. |
| 7,312,616 B2 | 12/2007 | Snyder |
| 7,323,879 B2 | 1/2008 | Kuo et al. |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,400,183 B1 | 7/2008 | Sivadasan et al. |
| 7,421,251 B2 | 9/2008 | Westwick et al. |
| 7,466,307 B2 | 12/2008 | Trent, Jr. et al. |
| 7,542,533 B2 | 6/2009 | Jasa et al. |
| 7,554,847 B2 | 6/2009 | Lee |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2001/0047509 A1 | 11/2001 | Mason et al. |
| 2002/0010716 A1 | 1/2002 | McCartney et al. |
| 2002/0016706 A1 | 2/2002 | Cooke et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll, Jr. |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2002/0191029 A1 | 12/2002 | Gillespie et al. |
| 2003/0011639 A1 | 1/2003 | Webb |
| 2003/0014447 A1 | 1/2003 | White |
| 2003/0025734 A1 | 2/2003 | Boose et al. |
| 2003/0041235 A1 | 2/2003 | Meyer |
| 2003/0056071 A1 | 3/2003 | Triece et al. |
| 2003/0058469 A1 | 3/2003 | Buis et al. |
| 2003/0061572 A1 | 3/2003 | McClannahan et al. |
| 2003/0062889 A1 | 4/2003 | Ely et al. |
| 2003/0080755 A1 | 5/2003 | Kobayashi |
| 2003/0097640 A1 | 5/2003 | Abrams et al. |
| 2003/0105620 A1 | 6/2003 | Bowen |
| 2003/0126947 A1 | 7/2003 | Moore et al. |
| 2003/0135842 A1 | 7/2003 | Frey et al. |
| 2003/0149961 A1 | 8/2003 | Kawai et al. |
| 2003/0229482 A1 | 12/2003 | Cook et al. |
| 2004/0017222 A1 | 1/2004 | Betz et al. |
| 2004/0054821 A1 | 3/2004 | Warren et al. |
| 2004/0153802 A1 | 8/2004 | Kudo et al. |
| 2004/0205553 A1 | 10/2004 | Hall et al. |
| 2004/0205617 A1 | 10/2004 | Light |
| 2004/0205695 A1 | 10/2004 | Fletcher |
| 2005/0024341 A1 | 2/2005 | Gillespie et al. |
| 2005/0143968 A9 | 6/2005 | Odom et al. |
| 2005/0240917 A1 | 10/2005 | Wu |

| | | | |
|---|---|---|---|
| 2005/0248534 | A1 | 11/2005 | Kehlstadt |
| 2005/0280453 | A1 | 12/2005 | Hsieh |
| 2006/0032680 | A1 | 2/2006 | Elias et al. |
| 2006/0097991 | A1 | 5/2006 | Hotelling et al. |
| 2006/0273804 | A1 | 12/2006 | Delorme et al. |
| 2007/0139074 | A1* | 6/2007 | Reblewski .......... 326/38 |
| 2008/0095213 | A1 | 4/2008 | Lin et al. |
| 2008/0186052 | A1* | 8/2008 | Needham et al. ........ 326/38 |
| 2008/0259998 | A1 | 10/2008 | Venkataraman et al. |

FOREIGN PATENT DOCUMENTS

| | | |
|---|---|---|
| EP | 0308583A2 A1 | 3/1989 |
| EP | 368398 A1 | 5/1990 |
| EP | 0450863A2 A1 | 10/1991 |
| EP | 0499383A2 A1 | 8/1992 |
| EP | 0639816A2 A1 | 2/1995 |
| EP | 1170671A1 A1 | 1/2002 |
| EP | 1205848 A1 | 5/2002 |
| EP | 1191423A2 A1 | 2/2003 |
| JP | 404083405 A1 | 3/1992 |
| JP | 405055842 A1 | 3/1993 |
| JP | 06021732 A1 | 1/1994 |
| JP | 404095408 A1 | 3/2002 |
| WO | 9532478 A1 | 11/1995 |
| WO | PCT/US96/17305 A1 | 6/1996 |
| WO | PCT/US98/34376 A1 | 8/1998 |
| WO | PCT/US99/09712 A1 | 2/1999 |

OTHER PUBLICATIONS

USPTO Notice of Allowance for U.S. Appl. No. 10/238,966 dated Jan. 27, 2009; 4 pages.
USPTO Non-Final Rejection for U.S. Appl. No. 10/238,966 dated Jun. 30, 2008; 12 pages.
USPTO Non-Final Rejection for U.S. Appl. No. 10/238,966 dated Dec. 26, 2007; 12 pages.
USPTO Final Rejection for U.S. Appl. No. 10/238,966 dated Sep. 27, 2007; 9 pages.
USPTO Notice of Allowance for U.S. Appl. No. 10/238,966 dated Apr. 19, 2007; 4 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Apr. 6, 2006; 8 pages.
USPTO Non-Final Rejection for U.S. Appl. No. 10/033,027 dated Mar. 31, 2009; 7 pages.
USPTO Non-Final Rejection for U.S. Appl. No. 10/033,027 dated Dec. 18, 2008; 5 pages.
USPTO Final Rejection for U.S. Appl. No. 10/033,027 dated Jun. 8, 2007; 8 pages.
USPTO Non-Final Rejection for U.S. Appl. No. 10/033,027 dated Dec. 21, 2006; 31 pages.
USPTO Final Rejection for U.S. Appl. No. 10/033,027 dated Aug. 9, 2006; 6 pages.
USPTO Non-Final Rejection for U.S. Appl. No. 10/033,027 dated Apr. 26, 2006; 26 pages.
USPTO Final Rejection for U.S. Appl. No. 10/033,027 dated Oct. 31, 2005; 24 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Oct. 18, 2004; 17 pages.
USPTO Non-Final Rejection for U.S. Appl. No. 10/001,478 dated Oct. 20, 2008; 18 pages.
USPTO Final Rejection for U.S. Appl. No. 10/001,478 dated Jun. 4, 2008; 7 pages.
USPTO Non-Final Rejection for U.S. Appl. No. 10/001,478 dated Jan. 30, 2008; 19 pages.
USPTO Final Rejection for U.S. Appl. No. 10/001,478 dated Sep. 17, 2007; 15 pages.
USPTO Non-Final Rejection for U.S. Appl. No. 10/001,478 dated Apr. 2, 2007; 17 pages.
USPTO Final Rejection for U.S. Appl. No. 10/001,478 dated Sep. 5, 2006; 19 pages.
USPTO Non-Final Rejection for U.S. Appl. No. 10/001,478 dated Mar. 15, 2006; 19 pages.
USPTO Final Rejection for U.S. Appl. No. 10/001,478 dated Oct. 24, 2005; 15 pages.
USPTO Non-Final Rejection for U.S. Appl. No. 10/001,478 dated May 16, 2005; 13 pages.
USPTO Notice of Allowance for U.S. Appl. No. 10/002,217 dated Jan. 28, 2009; 4 pages.
USPTO Notice of Allowance for U.S. Appl. No. 10/002,217 dated Oct. 14, 2008; 6 pages.
USPTO Notice of Allowance for U.S. Appl. No. 10/002,217 dated Jun. 6, 2008; 7 pages.
USPTO Final Rejection for U.S. Appl. No. 10/002,217 dated Feb. 6, 2008; 10 pages.
USPTO Non-Final Rejection for U.S. Appl. No. 10/002,217 dated Aug. 3, 2007; 10 pages.
USPTO Final Rejection for U.S. Appl. No. 10/002,217 dated Mar. 7, 2007; 12 pages.
USPTO Non-Final Rejection for U.S. Appl. No. 10/002,217 dated Oct. 2, 2006; 21 pages.
USPTO Non-Final Rejection for U.S. Appl. No. 10/002,217 dated Apr. 3, 2006; 4 pages.
USPTO Final Rejection for U.S. Appl. No. 10/002,217 dated Nov. 17, 2005; 17 pages.
USPTO Non-Final Rejection for U.S. Appl. No. 10/002,217 dated May 19, 2005; 15 pages.
USPTO Notice of Allowance for U.S. Appl. No. 10/001,477 dated Nov. 10, 2008; 7 pages.
USPTO Advisory Action for U.S. Appl. No. 10/001,477 dated Oct. 10, 2008; 3 pages.
USPTO Final Rejection for U.S. Appl. No. 10/001,477 dated Jun. 30, 2008; 15 pages.
USPTO Non-Final Rejection for U.S. Appl. No. 10/001,477 dated Dec. 6, 2007; 13 pages.
USPTO Final Rejection for U.S. Appl. No. 10/001,477 dated Jul. 23, 2007; 16 pages.
USPTO Non-Final Rejection for U.S. Appl. No. 10/001,477 dated Jan. 22, 2007; 15 pages.
USPTO Final Rejection for U.S. Appl. No. 10/001,477 dated Aug. 24, 2006; 13 pages.
USPTO Non-Final Rejection for U.S. Appl. No. 10/001,477 dated Mar. 2, 2006; 14 pages.
USPTO Final Rejection for U.S. Appl. No. 10/001,477 dated Oct. 24, 2005; 13 pages.
USPTO Non-Final Rejection for U.S. Appl. No. 10/001,477 dated May 11, 2005; 10 pages.
"Micropower CMOS Temperature Sensor with Digital Output;" Bakker et al., IEEE Journal of Solid-State Circuits, 1996; 3 pages.
"WP 3.5: An Integrated Time Reference;" Blauschild, Digest of Technical Papers, 1994; 4 pages.
"An Analog PPL-Based Clock and Data Recovery Circuit with High Input Jitter Tolerance;" Sun, Reprinted from IEEE Journal of Solid-State Circuits, 1989; 4 pages.
U.S. Appl. No. 09/842,966: "Precision Crystal Oscillator Circuit Used in Microcontroller," Mar; 28 pages.
U.S. Appl. No. 09/964,991: "A Novel Band-Gap Circuit for Providing an Accurate Reference Voltage Compensated for Process State. Process Variations and Temperature," Kutz et al.; 25 pages.
USPTO Non-Final Rejection for U.S. Appl. No. 09/975,115 dated Oct. 9, 2008; 34 pages.
USPTO Final Rejection for U.S. Appl. No. 09/975,115 dated May 12, 2008; 33 pages.
USPTO Non-Final Rejection for U.S. Appl. No. 09/975,115 dated Jan. 7, 2008; 30 pages.
USPTO Non-Final Rejection for U.S. Appl. No. 09/975,115 dated Jul. 31, 2007; 28 pages.
USPTO Final Rejection for U.S. Appl. No. 09/975,115 dated Feb. 21, 2007; 25 pages.
USPTO Non-Final Rejection for U.S. Appl. No. 09/975,115 dated Oct. 31, 2006; 19 pages.

USPTO Final Rejection for U.S. Appl. No. 09/975,115 dated Jun. 23, 2006; 20 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
USPTO Final Rejection for U.S. Appl. No. 09/975,338 dated Jan. 31, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.
USPTO Non-Final Rejection for U.S. Appl. No. 09/975,338 dated Sep. 6, 2006; 11 pages.
USPTO Advisory Action for U.S. Appl. No. 09/975,338 dated May 15, 2005; 4 pages.
USPTO Final Rejection for U.S. Appl. No. 09/975,338 dated Jan. 18, 2006; 12 pages.
USPTO Non-Final Rejection for U.S. Appl. No. 09/975,338 dated Apr. 5, 2005; 13 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. No. 10/008,096 dated Sep. 4, 2007; 19 pages.
USPTO Final Rejection for U.S. Appl. No. 10/008,096 dated Oct. 13, 2006; 17 pages.
USPTO Final Rejection for U.S. Appl. No. 10/008,096 dated Nov. 25, 2005; 17 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Non-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Notice of Allowance for U.S. Appl. No. 10/008,096 dated Dec. 22, 2008; 24 pages.
USPTO Notice of Allowance for U.S. Appl. No. 09/975,105 dated Dec. 4, 2006; 4 pages.
USPTO Final Rejection for U.S. Appl. No. 09/975,105 dated Jul. 13, 2006; 7 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
U.S. Appl. No. 09/943,062: "Apparatus and Method for Programmable Power Management in a Programmable Analog Circuit Block;" Mar; 46 pages.
U.S. Appl. No. 10/239,966: "Method for Parameterizing a User Module;" Perrin; 41 pages.
USPTO Notice of Allowance for U.S. 10/324,455 dated Feb. 12, 2004; 4 pages.
USPTO Non-Final Rejection for U.S. Appl. 10/324,455 dated Nov. 6, 2003; 4 pages.
USPTO Non-Final Rejection for U.S. Appl. No. 10/324,455 dated Aug. 21, 2003; 4 pages.
USPTO Notice of Allowance for U.S. Appl. No. 09/998,859 dated Mar. 14, 2005; 6 pages.
USPTO Non-Final Rejection for U.S. Appl. No. 09/998,859 dated Nov. 4, 2004; 6 pages.
USPTO Final Rejection for U.S. Appl. No. 09/998,859 dated Nov. 19, 2003; 5 pages.
USPTO Non-Final Rejection for U.S. Appl. No. 09/998,859 dated May 28, 2003; 6 pages.
USPTO Non-Final Rejection for U.S. Appl. No. 09/998,859 dated May 15, 2003; 6 pages.
USPTO Notice of Allowance for U.S. Appl. No. 09/998,834 dated May 19, 2005; 7 pages.
USPTO Non-Final Rejection for U.S. Appl. No. 09/998,834 dated Sep. 20, 2004; 11 pages.
USPTO Notice of Allowance for U.S. Appl. No. 10/113,065 dated Apr. 6, 2006; 8 pages.
USPTO Final Rejection for U.S. Appl. No. 10/113,065 dated Oct. 26, 2005; 17 pages.
USPTO Non-Final Rejection for U.S. Appl. No. 10/113,065 dated May 20, 2005; 14 pages.
U.S. Appl. No. 09/207,912: "Circuit(s), Architecture and Method(s) for Operating and/or Tuning a Ring Oscillator;" Mar; 23 pages.
USPTO Notice of Allowance for U.S. Appl. No. 10/001,477 dated May 8, 2009; 6 pages.
From U.S. Appl. No. 10/033,027 (CD00232): Goodenough, F. "Analog Counterparts of Fpgas Ease System Design" Electronic Design, Penton Publishing, Cleveland, Oh, US vol. 42, no. 21, 10/14/94; 10 pages.
From U.S. Appl. No. 10/033,027: Harbaum, T. et al. "Design of a Flexible Coprocessor Unit" Proceedings of the Euromicro Conference, XX XX, Sep. 1999; 10 pages.
From U.S. Appl. No. 10/033,027; "Programmable Microcontroller (PSoC) Architecture (Mixed Analog/Digital)"; Aug. 7, 2001; U.S. Appl. No. 09/924,734 Snyder et al.; 28 pages.
From U.S. Appl. No. 10/033,027; "Digital Configurable Macro Architecture"; Jul. 18, 2001; U.S. Appl. No. 09/909,045; Snyder; 37 pages.
From U.S. Appl. No. 10/033,027: "Configuring Digital Functions in a Digital Configurable Macro Architecture"; Jul. 18, 2001; U.S. Appl. No. 09/909,109; Snyder; 38 pages.
From U.S. Appl. No. 10/033,027: "A Programmable Analog System Architecture (As Amended)"; Jul. 18, 2001; U.S. Appl. No. 09/909,047; Mar; 60 pages.
From U.S. Appl. No. 10/033,027: "Programmable Methodology and Architecture for a Programmable Analog System (As Amended)"; Aug. 14, 2001; U.S. Appl. No. 09/930,021; Mar et al.; 87 pages.
From U.S. Appl. No. 10/033,027: "Method for Synchronizing and Resetting Clock Signals Supplied to Multiple Programmable Analog Blocks (As Amended)"; Oct. 1, 2001; U.S. Appl. No. 09/969;311; Sullam; 57 pages.
From U.S. Appl. No. 10/033,027: "Method and Apparatus for Programming a Flash Memory"; Jun. 5, 2001; U.S. Appl. No. 09/875,599; Snyder; 23 pages.
From U.S. Appl. No. 10/033,027: "In-System Chip Emulator Architecture"; Oct. 10, 2001; U.S. Appl. No. 09/975,115; Snyder et al.; 38 pages.
From U.S. Appl. No. 10/033,027: "A Configurable Input/Output Interface for a Microcontroller"; Sep. 14, 2001; U.S. Appl. No. 09/953,423; Kutz at al.; 28 pages.
From U.S. Appl. No. 10/033,027: "Multiple Use of Microcontroller Pad"; Jun. 26, 2001; 09/893,050; Kutz at al.; 21 pages.
From U.S. Appl. No. 10/033,027: "Programming Architecture for a Programmable Analog System"; Aug. 14, 2001; U.S. Appl. No. 09/929,891; Mar et al.; 82 pages.
From U.S. Appl. No. 10/033,027: "Architecture for Synchronizing and Resetting Clock Signals Supplied to Multiple Analog Programmable Analog Blocks"; Oct. 1, 2001; U.S. Appl. No. 09/969,313; Sullam; 50 pages.
USPTO Non-Final Rejection for U.S. Appl. No. 09/994,601 dated Nov. 14, 2006; 15 pages.
USPTO Final Rejection for U.S. Appl. No. 09/994,601 dated Mar. 8, 2006; 11 pages.
USPTO Non-Final Rejection for U.S. Appl. No. 09/994,601 dated Sep. 21, 2005; 12 pages.
USPTO Final Rejection for U.S. Appl. No. 09/994,601 dated Mar. 24, 2005; 10 pages.
Hintz et al.; "Microcontrollers", 1992, McGraw-Hill; 11 pages.
Ganapathy, Gopi, and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, Jun. 3-7, 1996; 4 pages.
The Provisional U.S. Appl. No. 60/243,708 "Advanced Programmable Microcontroller Device"; 277 pages.

"Webster's Third New International Dictionary", 1996, G. & C. Merriam Company; 3 pages.
USPTO Advisory Action for U.S. Appl. No. 09/998,848 dated Sep. 7, 2005; 3 pages.
U.S. Appl. No. 09/957,084: "A Crystal-Less Oscillator with Trimmable Analog Current Control for Increased Stability;" Mar; 28 pages.
U.S. Appl. No. 09/969,313: "Architecture for Synchronizing and Resetting Clock Signals Supplied to Multiple Analog Programmable System on a Chip Block;" Sullam; 50 pages.
U.S. Appl. No. 09/972,319: "Method for Applying Instructions to Microprocessor in Test Mode;" Snyder; 31 pages.
U.S. Appl. No. 09/972,003: "Test Architecture for Microcontroller Providing for a Serial Communication Interface;" Snyder; 32 pages.
U.S. Appl. No. 09/972,133: "Method for Entering Circuit Test Mode;" Snyder; 30 pages.
U.S. Appl. No. 09/973,535: "Architecture for Decimation Algorithm;" Snyder; 26 pages.
U.S. Appl. No. 09/977,111: A Frequency Doubler Circuit with Trimmable Current Control; Shutt; 35 pages.
U.S. Appl. No. 10/272,231: "Digital Configurable Macro Architecture;" Snyder; 36 pages.
U.S. Appl. No. 11/125,554: "A Method for a Efficient Supply to a Microcontroller;" Kutz; 1 page.
U.S. Appl. No. 09/855,868: "Protecting Access to Microcontroller Memory Blocks;" Snyder; 28 pages.
U.S. Appl. No. 09/887,923: "Novel Method and System for Interacting between a Processor and a Power on Reset to Dynamically Control Power States in a Microcontroller;" Kutz; 44 pages.
U.S. Appl. No. 10/000,383: "System and Method of Providing a Programmable Clock Architecture for an Advanced Microcontroller;" Sullam; 34 pages.
U.S. Appl. No. 10/001,477: "Breakpoint Control in an In-Circuit Emulation System;" Roe; 43 pages.
U.S. Appl. No. 10/004,197: "In-Circuit Emulator with Gatekeeper Based Halt Control;" Nemecek; 47 pages.
U.S. Appl. No. 10/004,039: "In-Circuit Emulator with Gatekeeper for Watchdog Timer;" Nemecek; 46 pages.
U.S. Appl. No. 10/002,217: "Conditional Branching in an In-Circuit Emulation System;" Nemeck; 43 pages.
U.S. Appl. No. 10/001,568: "Combined In-Circuit Emulator and Programmer;" Nemecek; 47 pages.
U.S. Appl. No. 10/001,478: "In-Circuit Emulator and POD Synchronized Boot;" Nemecek; 44 pages.
U.S. Appl. No. 09/887,955: "Novel Power on Reset Circuit for Microcontroller;" Kutz; 42 pages.
U.S. Appl. No. 09/826,397: "Method and Circuit for Allowing a Microprocessor to Change its Operating Frequency on-the-fly;" Sullam; 24 pages.
U.S. Appl. No. 09/893,048: "A Microcontroller having an On-Chip High Gain Amplifier;" Kutz; 22 pages.
U.S. Appl. No. 09/912,768: "A Microcontroller having a Dual Mode Relax Oscillator that is Trimmable;" Shutt; 33 pages.
U.S. Appl. No. 091922,419: "A Power Supply Pump Circuit for a Microcontroller;" Kutz; 38 pages.
U.S. Appl. No. 09/922,579: "A Method for a Efficient Supply to a Microcontroller;" Kutz; 37 pages.
U.S. Appl. No. 09/923,461: "Non-Interfering Multiply-Mac (Multiply Accumulate) Circuit;" Snyder; 25 pages.
U.S. Appl. No. 09/935,454: "Method and Apparatus for Local and Global Power Management in a Programmable Analog Circuit;" Mar; 51 pages.
U.S. Appl. No. 10/011,214: "Method and Circuit for Synchronizing a Write Operation between an On-CHip Microprocessor and an On-Chip Programmable Analog Device Operating at Different Frequencies;" Sullam; 49 pages.
Bursky, "FPGA Combines Multiple interfaces and Logic," Electronic Design, vol. 48 No. 20, pp. 74-78 (Oct. 2, 2000); 5 pages.
Anonymous, "Warp Nine Engineering - The IEEE 1284 Experts-F/Port Product Sheet," undated web page found at http://www.fapo.com/fport.htm; 2 pages.
Anonymous, "F/Port:Fast Parallel Port for the PC Installation Manual" Release 7.1, circa 1997, available for download from http://www.fapo.com/fport.htm; 25 pages.
Nam et al.; "Fast Development of Source-Level Debugging System Using Hardware Emulation"; IEEE 2000; 4 pages.
Huang et al.; "Iceberg: An Embedded In-Cicuit Emulator Synthesizer for Microcontrollers"; ACM 1999; 6 pages.
Khan et al.; "FPGA Architectures for Asic Hardware Emulators"; IEEE 1993; 5 pages.
Oh et al.; Emulator Environment Based on an FPGA Prototyping Board; IEEE 21-23; Jun. 2000; 6 pages.
Hong et al.; "An FPGA-Based Hardware Emulator for Fast Fault Emulation"; IEEE 1997; 4 pages.
Ching et al., "An In-Curcuit-Emulator for TMS320C25"; IEEE 1994; 6 pages.
Pasternak; "In-Circuit-Emulation in Asic Architecture Cor Designs"; IEEE 1989; 4 pages.
Metear; "Using Background Modes for Testing, Debugging and Emulation of Microcontrollers"; IEEE 1997; 8 pages.
Walters, Stephen; "Computer-Aided Prototyping for Asic-Based Systems", 1991, IEEE Design & Test of Computers; vol. 8, Issue 2; 8 pages.
Anonymous; "JEEN JTAG Embedded Ice Ethernet Interface"; Aug. 1999; Embedded Performance, Inc.; 3 pages.
Sedory; "A Guide to Debug"; 2004; retrieved on May 20, 2005; 7 pages.
"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.
Xerox; "Mesa Debugger Documentation"; Apr. 1979; Xerox Systems Development Department; Version 5.0; 33 pages.
Stallman et al.; "Debugging with the Gnu Source-Level Debugger"; Jan. 1994; retrieved on May 2, 2005 from http://www.cs.utah.edu; 4 pages.
Wikipedia.org; "Von Neumann architecture"; retrieved from http://en.wikipedia.org/wiki/Von_Neurnann_architecture on Jan. 22, 2007; 4 pages.
Stan Augarten; "The Chip Collection - Introduction - Smithsonian Institute"; "State of the Art"; "The First 256-Bit Static RAM"; retrieved on Nov. 14, 2005 from http://smithsonianchips.si.edu/augarten/p24.htm; 2 pages.
"POD - Piece of Data, Plain Old Documentation, Plain Old Dos . . . "; retrieved on Nov. 14, 2005 from http.//www.auditmypc.com/acronym/POD,asp; 2 pages.
USPTO Non-Final Rejection for U.S. Appl. No. 09/989,767 dated Oct. 6, 2004; 15 pages.
USPTO Final Rejection for U.S. Appl. No. 09/989,771 dated Feb. 27, 2007; 8 pages.
USPTO Final Rejection for U.S. Appl. No. 09/989,771 dated Mar. 28, 2006; 9 pages.
USPTO Final Rejection for U.S. Appl. No. 09/989,771 dated Apr. 6, 2005; 7 pages.
USPTO Final Rejection for U.S. Appl. No. 09/989,771 dated Dec. 10, 2008; 12 pages.
USPTO Final Rejection for U.S. Appl. No. 09/989,771 dated Dec. 27, 2007; 15 pages.
USPTO Non-Final Rejection for U.S. Appl. No. 09/989,771 dated May 28, 2008; 14 pages.
USPTO Non-Final Rejection for U.S. Appl. No. 09/989,771 dated Jul. 16, 2007; 14 pages.
USPTO Non-Final Rejection for U.S. Appl. No. 09/989,771 dated Aug. 23, 2006; 7 pages.
USPTO Non-Final Rejection for U.S. Appl. No. 09/989,771 dated Sep. 12, 2005; 7 pages.
USPTO Non-Final Rejection for U.S. Appl. No. 09/989,771 dated Sep. 22, 2004; 7 pages.
USPTO Final Rejection for U.S. Appl. No. 09/989,765 dated Apr. 3, 2007; 12 pages.
USPTO Final Rejection for U.S. Appl. No. 09/989,765 dated Apr. 4, 2008; 16 pages.
USPTO Final Rejection for U.S. Appl. No. 09/989,765 dated Apr. 17, 2006; 12 pages.

USPTO Non-Final Rejection for U.S. Appl. No. 09/989,765 dated Sep. 19, 2007; 14 pages.
USPTO Non-Final Rejection for U.S. Appl. No. 09/989,765 dated Sep. 26, 2008; 17 pages.
USPTO Non-Final Rejection for U.S. Appl. No. 09/989,765 dated Oct. 2, 2006; 13 pages.
USPTO Non-Final Rejection for U.S. Appl. No. 09/989,765 dated Oct. 5, 2005; 9 pages.
USPTO Non-Final Rejection for U.S. Appl. No. 09/989,782 dated Jul. 9, 2008; 10 pages.
USPTO Non-Final Rejection for U.S. Appl. No. 09/989,782 dated Jul. 24, 2007; 9 pages.
USPTO Final Rejection for U.S. Appl. No. 09/989,782 dated Sep. 21, 2006; 10 pages.
USPTO Final Rejection for U.S. Appl. No. 09/989,782 dated Nov. 3, 2005; 11 pages.
USPTO Non-Final Rejection for U.S. Appl. No. 09/989,782 dated Jan. 29, 2007; 9 pages.
USPTO Non-Final Rejection for U.S. Appl. No. 09/989,782 dated Mar. 28, 2006; 8 pages.
USPTO Non-Final Rejection for U.S. Appl. No. 09/989,782 dated Apr. 29, 2005; 11 pages.
USPTO Non-Final Rejection for U.S. Appl. No. 09/989,782 dated Oct. 6, 2004; 11 pages.
USPTO Non-Final Rejection for U.S. Appl. No. 09/989,782 dated Nov. 26, 2008; 10 pages.
USPTO Non-Final Rejection for U.S. Appl. No. 09/989,782 dated Dec. 14, 2007; 8 pages.
USPTO Final Rejection for U.S. Appl. No. 09/989,765 dated Mar. 31, 2009; 18 pages.
USPTO Final Rejection for U.S. Appl. No. 09/989,778 dated Mar. 16, 2009; 26 pages.
"Pod-Wikipedia, the free encyclopedia"; retrieved on Nov. 14, 2005 from http://en.wikipedia.org/wiki/Pod; 3 pages.
"pod-defintion by dict.die.net"; retrieved on Nov. 14, 2005 from http://dict.die.net/pod; 2 pages.
"In-Curcuit Emulators-descriptions of the major ICEs around"; retrieved on Nov. 14, 2005 from http://www.algonet.se/~staffann/developer/emulator.htm; 6 pages.
"Capturing Test/Emulation and Enabling Real-Time Debugging Using FPGA for In-Circuit Emulation:" Oct. 10, 2001; U.S. Appl. No. 09/975,104; Snyder; 35 pages.
USPTO Non-Final Rejection for U.S. Appl. No. 09/989,767 dated Jul. 24, 2008; 21 pages.
Anonymous; "Using Debug"; 1999; Prentice-Hall Publishing; 20 pages.
Harrison et al.; "Xilinx FPGA Design in a Group Environment Using VHDS and Synthesis Tools"; Colloquium on Digital System Design Using Synthesis Techniques; Feb. 15, 1996; 4 pages.
Microsoft Press Computer User's Dictionary; 1998; 3 pages.
Sreeram Duvvuru and Siamak Arya, "Evaluation of a Branch Target Address Cache," 1995; IEEE; 8 pages.
Andrew S. Tanenbaum with contributions from James R. Goodman, "Structured Computer Organization," 1999, Prentice Hall, Fourth Edition; 32 pages.
"Method for Breaking Execution of a Test Code in DUT and Emulator Chip Essentially Simultaneously and Handling Complex Breakpoint Events;" Oct. 10, 2001; U.S. Appl. No. 09/975,338; Nemecek et al.; 34 pages.
"Emulator Chip-Board Architecture for Interface;" Oct. 10, 2001; U.S. Appl. No. 09/975,030; Snyder et al.; 37 pages.
Wikipedia - Main Page, retrieved on Mar. 8, 2006 from http://en.wikipedia.org/wiki/Main_Page and http://en.wikipedia.org/Wikipedia:Introduction; 5 pages.
Wikipedia - Processor register, retrieved on Mar. 7, 2006 from http://en.wikipedia.org/wiki/Processor_register; 4 pages.
Jonathan B. Rosenburg, "How Debuggers Work" John Wiley & Sons, Inc. 1996; 259 pages.
Dahl, et al,: "Emulation of the Sparcle Microprocessor with the MIT Virtual Wires Emulation System"; 1994; IEEE; 9 pages.
Bauer et al.; "A Reconfigurable Logic Machine for Fast Event-Driven Simulation"; 1998; Design Automation Conference Proceedings; 8 pages.

"Host to FPGA Interface in an In-Circuit Emulation System;" Oct. 10, 2001; U.S. Appl. No. 09/975,105; Nemecek; 44 pages.
USPTO Advisory Action for U.S. Appl. No. 09/994,601 dated May 23, 2006; 3 pages.
USPTO Non-Final Rejection for U.S. Appl. No. 09/994,601 dated Jul. 29, 2004; 10 pages.
USPTO Ex Parte Qualyle Action for U.S. Appl. No. 09/992,076 dated Jun. 18, 2007; 6 pages.
USPTO Non-Final Rejection for U.S. Appl. No. 09/992,076 dated Oct. 10, 2006; 19 pages.
USPTO Notice of Allowance for U.S. Appl. No. 09/992,076 dated Mar. 26, 2008; 23 pages.
USPTO Notice of Allowance for U.S. Appl. No. 09/992,076 dated Jul. 29, 2008; 6 pages.
USPTO Advisory Action for U.S. Appl. No. 09/989,778 dated May 15, 2006; 4 pages.
USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.
USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2008; 24 pages.
USPTO Final Rejection for U.S. Appl. No. 09/989,778 dated Jul. 19, 2007; 18 pages.
USPTO Non-Final Rejection for U.S. Appl. No. 09/989,778 dated Sep. 1, 2005; 10 pages.
USPTO Non-Final Rejection for U.S. Appl. No. 09/989,778 dated Sep. 18, 2006; 11 pages.
USPTO Final Rejection for U.S. Appl. No. 09/998,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.
USPTO Final Rejection for U.S. Appl. No. 09/989,767 dated Jan. 11, 2007; 12 pages.
USPTO Final Rejection for U.S. Appl. No. 09/989,767 dated Jan. 15, 2009; 21 pages.
USPTO Final Rejection for U.S. Appl. No. 09/989,767 dated Mar. 6, 2006; 15 pages.
USPTO Final Rejection for U.S. Appl. No. 09/989,767 dated Apr. 6, 2005; 13 pages.
USPTO Final Rejection for U.S. Appl. No. 09/989,767 dated Dec. 27, 2007; 21 pages.
USPTO Non-Final Rejection for U.S. Appl. No. 09/989,767 dated Jul. 17, 2006; 12 pages.
USPTO Non-Final Rejection for U.S. Appl. No. 09/989,767 dated Jul. 2, 2007; 22 pages.
USPTO Notice of Allowance for U.S. Appl. No. 09/992,076 dated Nov. 13, 2008; 15 pages.
USPTO Final Rejection for U.S. Appl. No. 09/994,601 dated May 18, 2007; 17 pages.
USPTO Notice of Allowance for U.S. Appl. No. 09/992,076 dated Nov. 29, 2007; 8 pages.
USPTO Final Rejection for U.S. Appl. No. 09/992,076 dated Jan. 30, 2007; 32 pages.

USPTO Non-Final Rejection for U.S. Appl. No. 09/992,076 dated Aug. 10, 2006; 19 pages.
USPTO Final Rejection for U.S. Appl. No. 09/992,076 dated Mar. 17, 2006; 16 pages.
USPTO Non-Final Rejection for U.S. Appl. No. 09/992,076 dated Nov. 21, 2005; 29 pages.
USPTO Non-Final Rejection for U.S. Appl. No. 09/992,076 dated Jun. 1, 2005; 20 pages.
USPTO Notice of Allowance for U.S. Appl. No. 09/994,600 dated Nov. 12, 2008; 35 pages.
USPTO Notice of Allowance for U.S. Appl. No. 09/994,600 dated May 14, 2008; 22 pages.
USPTO Final Rejection for U.S. Appl. No. 09/994,600 dated Oct. 17, 2007; 13 pages.
USPTO Non-Final Rejection for U.S. Appl. No. 09/994,600 dated May 15, 2007; 14 pages.
USPTO Final Rejection for U.S. Appl. No. 09/994,600 dated Dec. 8, 2006; 14 pages.
USPTO Non-Final Rejection for U.S. Appl. No. 09/994,600 dated Jul. 17, 2006; 14 pages.
USPTO Final Rejection for U.S. Appl. No. 09/994,600 dated Feb. 13, 2006; 13 pages.
USPTO Non-Final Rejection for U.S. Appl. No. 09/994,600 dated Aug. 23, 2005; 13 pages.
USPTO Final Rejection for U.S. Appl. No. 09/994,600 dated May 4, 2005; 16 pages.
USPTO Non-Final Rejection for U.S. Appl. No. 09/994,600 dated Oct. 21, 2004; 37 pages.
USPTO Notice of Allowance for U.S. Appl. No. 10/001,477 dated Oct. 10, 2008; 13 pages.
USPTO Final Rejection for U.S. Appl. No. 10/001,477 dated Jun. 30, 2008; 19 pages.
USPTO Non-Final Rejection for U.S. Appl. No. 10/001,477 dated Dec. 6, 2007; 17 pages.
USPTO Final Rejection for U.S. Appl. No. 10/001,477 dated Jul. 23, 2007; 19 pages.
USPTO Non-Final Rejection for U.S. Appl. No. 10/001,477 dated Jan. 22, 2007; 17 pages.
USPTO Final Rejection for U.S. Appl. No. 10/001,477 dated Aug. 24, 2006; 15 pages.
USPTO Non-Final Rejection for U.S. Appl. No. 10/001,477 dated Mar. 2, 2006; 17 pages.
USPTO Final Rejection for U.S. Appl. No. 10/001,477 dated Oct. 24, 2005; 18 pages.
USPTO Non-Final Rejection for U.S. Appl. No. 10/001,477 dated May 11, 2005; 31 pages.
Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, Sep. 18-24, 2000; 6 pages.
Julio Faure et al.; "A Novel Mixed Signal Programmable Device With On-Chip Microprocessor", 1997, IEEE 1997 Custom Integrated Circuits Conference; 4 pages.
Monte Mar, Bert Sullam, Eric Blom; "An architecture for a configurable Mixed-signal device", 2003, IEEE Journal of Solid-State Circuits, vol. 3; 4 pages.
Robinson, Gordon D; "Why 1149.1 (JTAG) Really Works", May 1994, Conference Proceedings Electro/94 International, May 10-12, 1994, Combined Volumes; 6 pages.
USPTO Non-Final Rejection for U.S. Appl. No. 09/994,601 dated Oct. 4, 2007; 20 pages.
"PSoC designer: Integrated development environment, getting started 25-minute tutorial, version 1.0", Cypress Microsystems., Cypress Microsystems, Inc. CMS10006A, Jul. 3, 2001; 25 pages.
"PSoC technology complete changes 8-bit MCU system design", Cypress Microsystems, Inc. retrieved from <http:://www.archive.org/web/20010219005250/http://cypressmicro.com-/t...>, Feb. 19, 2001; 21 pages.
Specks et al., "A Mixed Digital-Analog 16B Microcontroller with 0.5MB Flash Memory, On-Chip Power Supply, Physical Newrok Interface, and 40V I/O for Automotive Single-Chip Mechatronics," IEEE, Feb, 9, 2000; 1 page.

Hsieh at al., "Modeling Micro-Controller Peripherals for High-Level Co-Simulation and Synthesis," IEEE, 1997; 4 pages.
USPTO Notice of Allowance for U.S. Appl. No. 09/989,777 dated Nov. 4, 2008; 3 pages.
USPTO Notice of Allowance for U.S. Appl. No. 09/989,777 dated Sep. 15, 2008; 28 pages.
USPTO Notice of Allowance for U.S. Appl. No. 09/989,777 dated Jul. 7, 2008; 23 pages.
USPTO Final Rejection for U.S. Appl. No. 09/989,777 dated Jan. 30, 2008; 14 pages.
USPTO Non-Final Rejection for U.S. Appl. No. 09/989,777 dated Sep. 11, 2007; 18 pages.
USPTO Final Rejection for U.S. Appl. No. 09/989,777 dated Mar. 13, 2007; 24 pages.
USPTO Non-Final Rejection for U.S. Appl. No. 09/989,777 dated Sep. 13, 2006; 18 pages.
USPTO Non-Final Rejection for U.S. Appl. No. 09/989,777 dated Apr. 11, 2006; 21 pages.
USPTO Final Rejection for U.S. Appl. No. 09/989,777 dated Dec. 21, 2005; 29 pages.
USPTO Non-Final Rejection for U.S. Appl. No. 09/989,777 dated Jul. 5, 2005; 36 pages.
USPTO Notice of Allowance for U.S. Appl. No. 09/994,601 dated Dec. 22, 2008; 15 pages.
USPTO Final Rejection for U.S. Appl. No. 09/994,601 dated Apr. 17, 2008; 24 pages.
U.S. Appl. No. 10/033,027: "Microcontrollable Programmable System on a Chip;" Snyder; 117 pages.
U.S. Appl. No. 10/803,030: "Programmable Microcontrollable Architecture (Mixed Analog/Digital);" Snyder; 13 pages.
"New Object Domain R3 Beta Now Available (Build 134)!" Mar. 13, 2001; <http://web.archive.org/web/200100331202605/www.objectdomain.com/domain30/index.html>; 2 pages.
"OMG XML Metadata Interchange (XMI) Specifications" 2000; 17 pages.
Electronic Tools Company; E-Studio User Manuel; 2000; retrieved from http://web.archive.org for site http://e-tools.com on Mar. 23, 2005; 77 pages.
Cover Pages Technology Reports; XML and Electronic Design Automation (EDA); Aug. 2000; retrieved from http://xml.coverpages.org on Mar. 23, 2005; 5 pages.
Microsoft Computer Dictionary "ActiveX" 2002; Microsoft Press; 5th Edition; 3 pages.
Wikipedia "XLM" retrieved on Jan. 29, 2007 from http://en.wikipedia.org/wiki/XML; 16 pages.
"VHDL Samples" retrieved on Jan. 29, 2007 from http://www.csee.umbc.edu/help/VHDL/samples/samples.shtml; 10 pages.
Anonymous, "Lotus Notes FAQ -- How do you generate unique document numbers?" Sep. 19, 1999; retrieved from www.keysolutions.com on Jul. 9, 2008; 1 page.
Ashok Bindra, "Programmable SoC Delivers A New Level of System Flexibility"; Electronic Design; Nov. 6, 2000; 11 pages.
Cypress MicroSystem, Inc. "Cypres Customer Forums" retrieved from <http://www.cypress.com/forums/messageview>; 1 page.
Cypress MicroSystem, Inc. "PsoC Designer: Integrated Development Environment User Guide"; Rev, 1.18; Sep. 8, 2003; 193 pages.
Hamblen, "Rapid Prototyping Using Field-Programmable Logic Devices" Jun. 2000, IEEE; 9 pages.
USPTO Final Rejection for U.S. Appl. No. 09/943,062 dated Apr. 30, 2004; 9 pages.
Snyder et al., "Xilinx's A-to-Z Systems Platform" Cahners Microprocessor, The Insider's Guide to Microprocessor Hardware, Feb. 6, 2001; 6 pages.
"PSoC Technology Completely Changes 8-bit MCU System Design" Cypress MicroSystem, Inc. Feb. 19, 2001; 21 pages.
USPTO Non-Final Rejection for U.S. Appl. No. 09/943,062 dated Dec. 8, 2003; 9 pages.
USPTO Advisory Action for U.S. Appl. No. 09/943,062 dated Sep. 25, 2003; 3 pages.
USPTO Final Rejection for U.S. Appl. No. 09/943,062 dated Jun. 27, 2003; 8 pages.
USPTO Non-Final Rejection for U.S. Appl. No. 09/943,062 dated Jan. 27, 2003; 7 pages.

USPTO Non-Final Rejection for U.S. Appl. No. 09/943,062 dated Sep. 11, 2002; 9 pages.
"PSoC Designer: Integrated Development Environment" User Guide; Revision 1.11; Last Revised Jul. 17, 2001; 109 pages.
Cypress Microsystems, "Cypress Microsystems Unveils Programmable System-on-a-Chip for Embedded Internet, Communications and Consumer Systems;" 2000, <http://www.cypressmicro.com/corporate/CY_Announces_nov_13_2000.html; 3 pages.
Huang et al., Iceberg, An Embedded In-Circuit Emulator Synthesizer for Microcontrollers, Proceedings of the 36th Design Automation Conference 1999; 6 pages.
Yoo et al., "Fast Hardware-Software Co-verification by Optimistic Execution of Real Processor," Proceedings of Design, Automation and Test in Europe Conference and Exhibition 2000; 6 pages.
USPTO Advisory Action for U.S. Appl. No. 09/943,062 dated Mar. 27, 2008; 3 pages.
USPTO Final Rejection for U.S. Appl. No. 09/943,062 dated Jan. 18, 2008; 8 pages.
USPTO Non-Final Rejection for U.S. Appl. No. 09/943,062 dated Jun. 22, 2007; 12 pages.
USPTO Miscellaneous Action for U.S. Appl. No. 09/943,062 dated Jan. 30, 2002; 2 pages.
USPTO Notice of Allowance for U.S. Appl. No. 10/113,064 dated Sep. 21, 2006; 7 pages.
USPTO Non-Final Rejection for U.S. Appl. No. 10/113,064 dated Apr. 6, 2006; 19 pages.
USPTO Final Rejection for U.S. Appl. No. 10/113,064 dated Oct. 18, 2005; 22 pages.
USPTO Non-Final Rejection for U.S. Appl. No. 10/113,064 dated Apr. 25, 2005; 15 pages.
U.S. Appl. No. 10/113,064: "Method and System for Debugging through Supervisory Operating Codes and Self Modifying Codes," Roe et al.; 36 pages.
USPTO Notice of Allowance for U.S. Appl. No. 09/930,021 dated Nov. 26, 2004; 4 pages.
USPTO Final Rejection for U.S. Appl. No. 09/930,021 dated Aug. 31, 2004; 8 pages.
USPTO Non-Final Rejection for U.S. Appl. No. 09/930,021 dated Apr. 26, 2004; 6 pages.
USPTO Miscellaneous Action with SSP for U.S. Appl. No. 09/930,021 dated Oct. 1, 2001; 1 page.
USPTO Notice of Allowance for U.S. Appl. No. 09/953,423 dated Jul. 12, 2004; 6 pages.
USPTO Non-Final Rejection for U.S. Appl. No. 09/953,423 dated Feb. 6, 2004; 5 pages.
USPTO Notice of Allowance for U.S. Appl. No. 09/957,084 dated May 18, 2004; 5 pages.
USPTO Final Rejection for U.S. Appl. No. 09/957,084 dated Jan. 29, 2004; 8 pages.
USPTO Non-Final Rejection for U.S. Appl. No. 09/957,084 dated Aug. 27, 2003; 8 pages.
USPTO Final Rejection for U.S. Appl. No. 09/957,084 dated Apr. 23, 2003; 8 pages.
USPTO Non-Final Rejection for U.S. Appl. No. 09/957,084 dated Aug. 23, 2002; 6 pages.
USPTO Notice of Allowance for U.S. Appl. No. 09/969,313 dated Oct. 4, 2005; 6 pages.
USPTO Non-Final Rejection for U.S. Appl. No. 09/969,313 dated May 6, 2005; 9 pages.
USPTO Requirement for Restriction/Election for U.S. Appl. No. 09/969,313 dated Mar. 18, 2005; 6 pages.
USPTO Notice of Allowance for U.S. Appl. No. 09/969,311 dated Mar. 1, 2005; 4 pages.
USPTO Non-Final Rejection for U.S. Appl. No. 09/969,311 dated Sep. 21, 2004; 4 pages.
USPTO Advisory Action for U.S. Appl. No. 09/969,311 dated Jul. 21, 2003; 2 pages.
USPTO Final Rejection for U.S. Appl. No. 09/969,311 dated Apr. 7, 2003; 7 pages.
USPTO Non-Final Rejection for U.S. Appl. No. 09/969,311 dated Nov. 6, 2002; 8 pages.
USPTO Notice of Allowance for U.S. Appl. No. 09/972,319 dated Dec. 30, 2004; 4 pages.
USPTO Non-Final Rejection for U.S. Appl. No. 09/972,319 dated Sep. 16, 2004; 9 pages.
USPTO Notice of Allowance for U.S. Appl. No. 09/972,003 dated Jul. 14, 2004; 4 pages.
USPTO Requirement for Restriction/Election for U.S. Appl. No. 09/972,003 dated May 6, 2004; 4 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Notice of Allowance for U.S. Appl. No. 09/972,133 dated Jun. 9, 2006; 6 pages.
USPTO Final Rejection for U.S. Appl. No. 09/972,133 dated Mar. 30, 2006; 8 pages.
USPTO Non-Final Rejection for U.S. Appl. No. 09/972,133 dated Nov. 25, 2005; 9 pages.
USPTO Advisory Action for U.S. Appl. No. 09/972,133 dated Aug. 31, 2005; 3 pages.
USPTO Final Rejection for U.S. Appl. No. 09/972,133 dated Jun. 29, 2005; 10 pages.
USPTO Non-Final Rejection for U.S. Appl. No. 09/972,133 dated Mar. 8, 2005; 9 pages.
USPTO Notice of Allowance for U.S. Appl. No. 09/975,104 dated Oct. 19, 2006; 6 pages.
USPTO Non-Final Rejection for U.S. Appl. No. 09/975,104 dated Jun. 16, 2006; 8 pages.
USPTO Final Rejection for U.S. Appl. No. 09/975,104 dated Feb. 15, 2006; 7 pages.
USPTO Non-Final Rejection for U.S. Appl. No. 09/975,104 dated Aug. 16, 2005; 6 pages.
USPTO Non-Final Rejection for U.S. Appl. No. 09/975,104 dated Mar. 21, 2005; 7 pages.
USPTO Notice of Allowance for U.S. Appl. No. 09/975,030 dated Feb. 6, 2006; 7 pages.
USPTO Non-Final Rejection for U.S. Appl. No. 09/975,030 dated Oct. 20, 2005; 7 pages.
USPTO Non-Final Rejection for U.S. Appl. No. 09/975,030 dated Mar. 29, 2005; 13 pages.
USPTO Notice of Allowance for U.S. Appl. No. 09/977,111 dated Sep. 28, 2006; 6 pages.
USPTO Notice of Allowance for U.S. Appl. No. 10/272,231 dated Mar. 8, 2004; 6 pages.
USPTO Final Rejection for U.S. Appl. No. 10/272,231 dated Nov. 5, 2003; 5 pages.
USPTO Non-Final Rejection for U.S. Appl. No. 10/272,231 dated Jul. 14, 2003; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007; 7 pages.
USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004; 7 pages.
USPTO Notice of Allowance for U.S. Appl. No. 09/875,599 dated Oct. 17, 2006; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006; 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.

USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001568 dated Mar. 17, 2006; 17 pages.
USPTO Final Rejection for U.S. Appl. No. 10/001,568 dated Oct. 26, 2005; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 091923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages
USPTO Non-Final Rejection for U.S. Appl. No. 10/011,214 dated Aug. 13, 2004; 10 pages.
Hong et al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998; 9 pages. L.,.
Andrews, "Roadmap for Extending IEEE 1149.1 for Hierarchical Control of Locally-Stored, Standardized command Set, Test Programs," IEEE, 1994; 7 pages
Adham et al., "Preliminary Outline of the IEEE P1500 Scalable Architecture for Testing Embedded Cores," IEEE; 6 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE, 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.
Atmel Corporation: AT9OSC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled," Derwent Information LTD; 2002; 2 pages.
Morrison, "IBM Eyes Merchant Packaging Services," Jul. 13, 1998; Electronic News <http://www.findarticles.com>; 4 pages.
Charles, Jr. et al., "Wirebonding: Reinventing the Process for MCMs," Apr. 1998; IEEE 7th International Conference on Multichip Modules and High Density Packaging; 3 pages.
Tran et al., "Fine Pitch and Wirebonding and Reliability of Aluminum Capped Copper Bond Pads," May 2000, IEEE Electronic Components and Technology Conference; 8 pages.
Song at al., "A 50% Power Reduction Scheme for CMOS Relaxation Oscillator," IEEE, 1999; 4 pages.
"Electronic Circuit Protector-Circuit Breaker;" IBM Technical Disclosure Bulletin; vol. 36, Issue 8, Aug. 1, 1993; 1 page.
USPTO Final Rejection for U.S. Appl. No. 101001,478 dated Apr. 20, 2009; 16 pages.
USPTO Notice of Allowance for U.S. Appl. No. 09/994,600 dated Apr. 3, 2009; 5 pages.

USPTO Notice of Allowance for U.S. Appl. No. 09/989,777 dated Mar. 9, 2009; 7 pages.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 091989,762 dated Mar. 25, 2009; 7 pages.
USPTO Notice of Allowance for U.S. Appl. No. 09/989,762 dated Oct. 24, 2008; 7 pages.
U.S. Appl. No. 09/989,815: "A Data Driven Method and System for Monitoring Hardware Resource Usage for Programming an Electric Device;" Bartz et al.; 36 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007; 15 pages.
USPTO Final Rejection for U.S. Appl. No. 09/989,762 dated Jan. 26, 2007; 13 pages.
USPTO Non-Final Rejection for U.S. Appl. No. 09/989,762 dated Aug. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
U.S. Appl. No. 09/275,336: "Programmable Oscillator Scheme;" Mar et al.; 25 pages.
U.S. Appl. No. 09/721,316: "Programmable Oscillator Scheme;" Mar et al.; 26 pages.
U.S. Appl. No. 10/324,455: "Programmable Oscillator Scheme;" Mar et al.; 23 pages.
U.S. Appl. No. 09/998,859: "A System and a Method for Checking Lock Step Consistency between in Circuit Emulation and a Microcontroller while Debugging Process is in Progress;" Nemecek; 33 pages.
U.S. Appl. No. 09/998,834: "A System and a Method for Communication between and Ice and a Production Microcontroller while in a Halt State;" Nemecek; 33 pages.
U.S. Appl. No. 10/113,065: "System and Method for Automatically Matching Components in a Debugging System;" Nemecek et al.; 32 pages.
U.S. Appl. No. 09/989,574: "Method and System for using a Graphics user Interface for Programming an Electronic Device;" Bartz et al.; 43 pages.
U.S. Appl. No. 09/989,816: "Datasheet Browsing and Creation with Data-Driven Datasheet Tabs within a Microcontroller Design Tool;" Bartz et al.; 55 pages.
U.S. Appl. No. 11/322,044, filed Dec. 28, 2005, Stiff.
U.S. Appl. No. 11/850,260: "Circuit and Method for Improving the Accuracy of a Crystal-less Oscillator Having Dual-Frequency Modes;" Wright et al.; 33 pages.
USPTO Non-Final Rejection for U.S. Appl. No. 11/850,260 dated Mar. 6, 2009; 7 pages.
USPTO Non-Final Rejection for U.S. Appl. No. 11/644,100 dated Mar. 9, 2009; 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 111644,100 dated Apr. 14, 2008; 10 pages.
USPTO Notice of Allowance for U.S. Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 8 pages.
USPTO Notice of Allowance for U.S. Appl. No. 12/218,404 dated Mar. 19, 2009; 7 pages.

USPTO Non-Final Rejection for U.S. Appl. No. 12/218,404 dated Sep. 30, 2008; 8 pages.
U.S. Appl. No. 11/644,100: "Differential-to-single ended signal converter circuit and method," Stiff; 33 pages.
U.S. Appl. No. 11/415,588: "Voltage Controlled Oscillator Delay Cell and Method," Sivadasan; 24 pages.
U.S. Appl. No. 12/218,404: "Voltage Controlled Oscillator Delay Cell and Method," Sivadasan; 23 pages.
USPTO Notice of Allowance for U.S. Appl. No. 11/132,894 dated Apr. 26, 2007; 4 pages.
USPTO Non-Final Rejection for U.S. Appl. No. 11/132,894 dated Dec. 19, 2006; 12 pages.
U.S. Appl. No. 11/132,894; "Open Loop Bandwidth Test Architecture and Method for Phase Locked Loop (PLL)," Stiff; 38 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
U.S. Appl. No. 11/322,044: "Split charge pump PLL architecture," Stiff; 19 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.
USPTO Non-Final Rejection for U.S. Appl. No. 10/305,589 dated Oct. 7, 2003; 6 pages.
U.S. Appl. No. 10/305,589: "Current Controlled Delay Circuit," Stiff; 18 pages.
U.S. Appl. No. 09/849,164: "Reduced Static Phase Error CMOS PLL Charge Pump," Stiff; 30 pages.
Maneatis, "Low-Jitter Process-Independent DLL and PLL1 Based on Self-Biased Techniques," IEEE Journal of Solid-State Circuits, vol. 31, No. 11, Nov. 1996; 10 pages.
Larsson, "A 2-1600-MHz CMOS Clock Recovery PLL with Low-V dd Capability," IEEE Journal of Solid-State Circuits, vol. 34, No. 12, Dec. 1999; 10 pages.
USPTO Notice of Allowance for U.S. Appl. No. 10/327,217 dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 page.
U.S. Appl. No. 10/327,217: "Single Ended Clock Signal Generator Having a Differential Output," Richmond et al.; 27 pages.
USPTO Notice of Allowance for U.S. Appl. No. 10/871,582 dated Mar. 30, 2006; 6 pages.
USPTO Final Rejection for U.S. Appl. No. 10/871,582 (CD03036) dated Feb. 1, 2006; 5 pages.
USPTO Non-Final Rejection for U.S. Appl. No. 10/871,582 dated Sep. 7, 2005; 7 pages.
U.S. Appl. No. 10/871,582: "LVDS Input Circuit with Extended Common Mode Range," Reinschmidt et al.; 25 pages.
USPTO Notice of Allowance for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.

USPTO Non-Final Rejection for U.S. Appl. No. 09/404,891 dated Oct. 11, 2002; 5 pages.
U.S. Appl. No. 09/404,891: "Method, Architecture and Circuitry for Controlling Pulse Width in a Phase and/or Frequency Detector," Scott et al.; 17 pages.
USPTO Notice of Allowance for U.S. Appl. No. 10/226,911 dated Aug. 20, 2004; 4 pages.
USPTO Non-Final Rejection for U.S. Appl. No. 10/226,911 dated Mar. 19, 2004; 6 pages.
U.S. Appl. No. 101226,911: "Calibration of Integrated Circuit Time Constants," Gehring et al.; 32 pages.
USPTO Notice of Allowance for U.S. Appl. No. 09/943,149 dated Jan. 12, 2004; 7 pages.
USPTO Non-Final Rejection for U.S. Appl. No. 09/943,149 dated Aug. 28, 2003; 9 pages.
USPTO Final Rejection for U.S. Appl. No. 09/943,149 dated May 7, 2003; 10 pages.
USPTO Non-Final Rejection for U.S. Appl. No. 09/943,149 dated Nov. 20, 2002; 7 pages.
U.S. Appl. No. 091943,149: "Method for Phase Locking in a Phase Lock Loop," Moyal et al.; 21 pages.
Durham at al., "Integrated Continuous-Time Balanced Filters for 16-bit DSP Interfaces," IEEE, 1993; 6 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
U.S. Appl. No. 09/047,595: "Roving Range Control to Limit Receive PLL Frequency of Operation," Scott; 35 pages.
U.S. Appl. No. 09/216,460: "Circuit and Method for Controlling an Output of a Ring Oscillator," Abugharbieh et al.; 21 pages.
U.S. Appl. No. 09/471,914 : "Reference-Free Clock Generator and Data Recovery PLL," Dalmia at al.; 32 pages.
U.S. Appl. No. 09/471,576: "Reference-Free Clock Generation and Data Recovery PLL," Dalmia; 30 pages.
U.S. Appl. No. 10/083,442: "Method/Architecture for a Low Gain PLL with Wide Frequency Range," Meyers at al.; 28 pages.
U.S. Appl. No. 09/470,665: "Digital Phase/Frequency Detector, and Clock Generator and Data Recovery PLL Containing the Same," Dalmia; 26 pages.
U.S. Appl. No. 09/893,161: "Architecture of a PLL with Dynamic Frequency Control on a PLD," Moore; 32 pages.
U.S. Appl. No. 09/608,753: "PLL Lockout Watchdog," Wilson et al.; 24 pages.
U.S. Appl. No. 09/398,956: "Frequency Acquisition Rate Control in Phase Lock Loop Circuits," Moyal et al.; 35 pages.
U.S. Appl. No. 09/747,262: "Linearized Digital Phase-Locked Loop," Williams et al.; 9 pages.
U.S. Appl. No. 09/981,448: "Oscillator Tuning Method," Hauck; 28 pages.
U.S. Appl. No. 09/538,989: "Memory Based Phase Locked Loop," Krishnan; 27 pages.
U.S. Appl. No. 09/048,905: "Programmable Clock Generator," Mann et al.; 42 pages.
U.S. Appl. No. 08/865,342: "Programmable Clock Generator," Mann et al.; 41 pages.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
U.S. Appl. No. 10/293,392: "Low Voltage Receiver Circuit and Method for Shifting the Differential Input Signals of the Receiver Depending on a Common Mode Voltage of the Input Signals," Maher et al.; 20 pages.
USPTO Notice of Allowance for U.S. Appl. No. 10/288,003 dated Jan. 14, 2005; 6 pages.
USPTO Final Rejection for U.S. Appl. No. 10/288,003 dated Oct. 6, 2004; 6 pages.
USPTO Non-Final Rejection for U.S. Appl. No. 10/288,003 dated Apr. 7, 2004; 9 pages
U.S. Appl. No. 10/288,003: "Low Voltage Differential Signal Driver Circuit and Method," Roper et al.; 30 pages.
USPTO Notice of Allowance for U.S. Appl. No. 09/989,777 dated Jun. 9, 2009; 7 pages.
USPTO Advisory Action for U.S. Appl. No. 11/200,619 dated May 11, 2009; 3 pages.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
U.S. Appl. No. 11/200,619: "Providing hardware independence to automate code generation of processing device firmware," Snyder et al.; 41 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
U.S. Appl. No. 11/201,922: "Design model for a hardware device-independent method of defining embedded firmware for programmable systems," McDonald et al.; 31 pages.
USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
U.S. Appl. No. 11/201,627: "Method and an apparatus to design a processing system using a graphical user interface," Ogami et al.; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
U.S. Appl. No. 09/989,808: "Automatic generation of application program interfaces, source code, interrupts, and data sheets for microcontroller programming," Bartz et al.; 67 pages.
USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
U.S. Appl. No. 10/109,979: "Graphical user interface with logic unifying functions," Anderson et al.; 100 pages.
U.S. Appl. No. 09/979,781: "System and method for decoupling and iterating resources associated with a module," Ogami et al.; 40 pages.
U.S. Appl. No. 09/989,775: "User defined names for registers in memory banks derived from configurations," Ogami et al.; 29 pages.
USPTO Notice of Allowance for U.S. Appl. No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
U.S. Appl. No. 09/989,819: "System and method for creating a boot file utilizing a boot template," Ogami et al.; 43 pages.
USPTO Notice of Allowance for U.S. Appl. No. 09/989,761 dated Jan. 14, 2005; 6 pages.
USPTO Non-Final Rejection for U.S. Appl. No. 09/989,761 dated Mar. 10, 2004; 6 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 09/989,761 dated Apr. 18, 2003; 5 pages.
U.S. Appl. No. 09/989,761: "Storing of global parameter defaults and using them over two or more design projects," Ogami et al.; 37 pages.
Wang, et al. "Synthesizing Operating System Based Device Drivers in Embedded Systems," 2003, ACM; 8 pages.

Lutovac et al. "Symbolic Computation of Digital Filter Transfer Function Using Matlab," Proceedings of 23rd International Conference on Microelectronics (MIEL 2002), vol. 2 NIS, Yugoslavia; 4 pages.

Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.

Xilinx, Virtex-II Pro Platform FPGA Developer's Kit, "How Data2BRAM Fits in with Hardware and Software Flows," Chapter 2: Using Data2BRAM; Jan. 2003 Release; 2 pages.

PCT Preliminary Report on Patentability (Chapter 1 of the Patent Cooperation Treaty), PCT/US2005/028793, filed Aug. 12, 2005, mailed Dec. 21, 2007; 2 page.

PCT Written Opinion of the International Searching Authority for PCT/US2005/028793, filed Aug. 12, 2005, mailed Nov. 19, 2007; 7 pages.

PCT international Search Report of the International Searching Authority for PCT/US05/28793, filed Aug. 12, 2005, mailed Nov. 19, 2007; 5 pages.

International Search Report and Written Opinion of the International Searching Authority for PCT/US05/28898, filed Aug. 12, 2005, mailed Mar. 6, 2007; 6 pages.

Burogs et al., "Power Converter Analysis and Design using Matlab: A Transfer Function Approach," Proceedings of IEEE International Symposium on Industrial Electronics 1998, vol. 2; 6 pages.

Efstathiou, "Analog Electronics: Basic Circuits of Operational Amplifiers," <http://web.archive.org/web/20021231045232> Dec. 31, 2002, version, retrieved from the Internet Archives; 10 pages.

PCT International Search Report for PCT/US05/28791, filed Aug. 12, 2005, mailed Mar. 31, 2008; 4 pages.

PCT International Search Report for PCT/US05/28791, filed Aug. 12, 2005, mailed Mar. 31, 2008; 8 pages.

Kory Hopkins, "Definition;" Jan. 16, 1997; <http://www.cs.sfu.ca/cs/ceopfe/GradStudent.html; 1 p. —1.

Ebeling et al, "Validating VLSI Circuit Layout by Wirelist Comparison;" Sep. 1983; in proceedings of the IEEE International Conference on Computer Aided Design (ICCAD-83); 2 pages.

"The Gemini Netlist Comparison Project" <http://wvvw.cs.washington.edu/research/projects/lis/wvvw/gemini/gemini.html> larry@cs.washington.edu; 2 pages.

Ohlrich et al., "Sub-Gemini: Identifying Subcircuits using a Fast Subgraph Isomorphism Algorithm," Jun. 1993; in proceedings of the 30th IEEE/ACM Design Automation Conference; 7 pages.

Ebling, "Gemini II: A Second Generation Layout Validation Program;" 1988; in proceedings of the IEEE International Conference on Computer Aided Design (ICCAD-88); 4 pages.

U.S. Appl. No. 12/132,527; "System and Method for Performing Next Placements and Pruning of Disallowed Placements for Programming an Integrated Circuit;" Ogami et al.; 44 pages.

U.S. Appl. No. 12/356,468: "System and Method for Dynamically Generating a Configuration Datasheet," Anderson et al.; filed on Jan. 20, 2009; 27 pages.

USPTO Notice of Allowance for U.S. Appl. No. 11/986,338 dated May 7, 2009; 1 page.

USPTO Notice of Allowance for U.S. Appl. No. 091475,879 dated Oct. 22, 2004; 7 pages.

USPTO Advisory Action for U.S. Appl. No. 09/475,879 dated Mar. 4, 2002; 3 pages.

USPTO Advisory Action for U.S. Appl. No. 09/475,879 dated Dec. 31, 2001; 3 pages.

USPTO Final Rejection for U.S. Appl. No. 09/475,879 dated Oct. 11, 2001; 10 pages.

USPTO Non-Final Rejection for U.S. Appl. No. 09/475,879 dated Mar. 8, 2001; 6 pages.

U.S. Appl. No. 09/475,879: "Programmable Logic Device," Lacey et al.; filed on Dec. 30, 1999; 50 pages.

U.S. Appl. No. 09/475,808: "Configurable Memory for Programmable Logic Circuits," Lacey et al.; 24 pages.

USPTO Non-Final Rejection for U.S. Appl. No. 09/475,808 dated Jun. 6, 2001; 8 pages.

USPTO Notice of Allowance for U.S. Appl. No. 09/475,808 dated Nov. 6, 2001; 8 pages.

U.S. Appl. No. 10/137,497: "Reconfigurable Testing System and Method," Pleis et al.; filed on May 1, 2002; 40 pages.

USPTO Non-Final Rejection for U.S. Appl. No. 10/137,497 dated Nov. 5, 2004; 17 pages.

USPTO Final Rejection for U.S. Appl. No. 10/137,497 dated May 5, 2005; 13 pages.

USPTO Non-Final Rejection for U.S. Appl. No. 10/137,497 dated Sep. 22, 2005; 21 pages.

USPTO Final Rejection for U.S. Appl. No. 10/137,497 dated Mar. 13, 2006, 15 pages.

USPTO Non-Final Rejection for U.S. Appl. No. 10/137,497 dated Aug. 2, 2006; 21 pages.

USPTO Notice of Allowance for U.S. Appl. No. 10/137,497 dated Jan. 24, 2007; 12 pages.

USPTO Notice of Allowance for U.S. Appl. No. 10/137,497 dated Jul. 20, 2007; 4 pages.

U.S. Appl. No. 10/653,050: "Method and System for Programming a Memory Device," Snyder et al.; filed on Aug. 29, 2003; 69 pages.

USPTO Non-Final Rejection for U.S. Appl. No. 10/653,050 dated Apr. 6, 2004; 7 pages.

USPTO Notice of Allowance for U.S. Appl. No. 10/653,050 dated Jul. 29, 2004; 3 pages.

U.S. Appl. No. 10/172,670: "Method and System for Programming a Memory Device," Snyder et al.; filed on Jun. 13, 2002; 66 pages.

U.S. Appl. No. 11/986,338: Reconfigurable Testing System and Method, Pleis et al., filed on Nov. 20, 2007; 41 pages.

U.S. Appl. No. 111273,708: "Capacitance Sensor Using Relaxation Oscillators," Snyder et al.; 33 pages.

USPTO Non-Final Rejection for U.S. Appl. No. 11/273,708 dated Mar. 19, 2007; 16 pages.

USPTO Final Rejection for U.S. Appl. No. 11/273,708 dated Jul. 5, 2007; 8 pages.

USPTO Notice of Allowance for U.S. Appl. No. 11/273,708 dated Aug. 9, 2007; 4 pages.

U.S. Appl. No. 11/337,272: "Successive Approximate Capacitance Measurement Circuit;" Snyder; 29 pages.

USPTO Requirement for Restriction/Election for U.S. Appl. No. 11/337,272 dated Sep. 11, 2006; 5 pages.

USPTO Non-Final Rejection for U.S. Appl. No. 11/337,272 dated Oct. 24, 2006; 9 pages.

USPTO Final Rejection for U.S. Appl. No. 11/337,272 dated Feb. 2, 2007; 11 pages.

USPTO Advisory Action for U.S. Appl. No. 11/337,272 dated Apr. 3, 2007; 3 pages.

USPTO Non-Final Rejection for U.S. Appl. No. 11/337,272 dated May 17, 2007; 11 pages.

USPTO Notice of Allowance for U.S. Appl. No. 11/337,272 dated Aug. 15, 2007; 9 pages.

U.S. Appl. No. 11/983,291: "Successive Approximate Capacitance Measurement Circuit," Snyder; 26 pages.

USPTO Non-Final Rejection for U.S. Appl. No. 11/983,291 dated Mar. 9, 2009; 9 pages.

U.S. Appl. No. 11/698,660: "Configurable Bus," Kutz et al.; 35 pages.

USPTO Non-Final Rejection for U.S. Appl. No. 11/698,660 dated Dec. 2, 2008; 12 pages.

USPTO Final Rejection for U.S. Appl. No. 11/698,660 dated May 28, 2009; 12 pages.

U.S. Appl. No. 11/709,866: "Input/Output Multiplexer Bus," Dennis Sequine; 33 pages.

USPTO Non-Final Rejection for U.S. Appl. No. 11/709,866 dated Nov. 7, 2008; 14 pages.

USPTO Notice of Allowance for U.S. Appl. No. 11/709,866 dated Apr. 7, 2009; 8 pages.

Sedra et al., "Microelectronic Circuits," 3rd Edition, Oxford University Press; 20 pages.

Van Ess, David; "Simulating a 555 Timer with PSoC," Cypress Semiconductor Corporation, Application Note AN2286, May 19, 2005; 10 pages.

Cypress Semiconductor Corporation, "Fan Controller CG6457AM and CG6462AM," PSoC Mixed Signal Array Preliminary Data Sheet; May 24, 2005; 25 pages.

Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "CY8C21x34 Data Sheet," CSR User Module, CSR V.1.0; Oct. 6, 2005; 36 pages.
Chapweske, Adam; "The PS/2 Mouse Interface," PS/2 Mouse Interfacing, 2001; 11 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Seguine, Ryan; "Layout Guidelines for PSoC CapSense," Cypress Semiconductor Corporation, Application Note AN2292; Jul. 22, 2005; 13 pages.
Lee, Mark; "EMC Design Considerations for PSoC CapSense Applications," Cypress Semiconductor Corporation, Application Note AN2318; Sep. 16, 2005; 6 pages.
Cypress Semiconductor Corporation, "Release Notes srn017," Jan. 24, 2007; 3 pages.
Cypress Semiconductor Corporation, "PSoC CY8C20x34 Technical Reference Manual (TRM)," PSoC CY8C20x34 TRM, Version 1.0, 2006; 220 pages.
U.S. Appl. No. 111166,622: "Touch wake for electronic devices," Beard et al.; 22 pages.
International Written Opinion of the International Searching Authority for International Application No. PCT/US2006/09572 dated Jan. 10, 2008; 5 pages.
International Search Report for International Application No. PCT/US2006/09572 dated Jan. 10, 2008; 2 pages.
USPTO Notice of Allowance for U.S. Appl. No. 10/024,093 dated Sep. 10, 2002; 7 pages.
U.S. Appl. No. 10/024,093: "Configurable Memory for Programmable Logic Circuits," Lacey et al.; 25 pages.
USPTO U.S. Appl. No. 10/002,726: "Method and Apparatus for Generating Microcontroller Configuration Information," Ogami et al., filed on Oct. 24, 2001; 54 pages.
USPTO Notice of Allowance for U.S. Appl. No. 10/002,726dated Feb. 06, 2007; 7 pages.
USPTO Non-Final Rejection for U.S. Appl. No. 10/002,726 dated Aug. 28, 2006; 10 pages.
USPTO Final Rejection for U.S. Appl. No. 10/002,726 dated Mar. 27, 2006; 8 pages.
USPTO Final Rejection for U.S. Appl. No. 10/002,726 dated Nov. 30, 2005; 10 pages.
USPTO Non-Final Rejection for U.S. Appl. No. 101002,726 dated Jun. 10, 2005; 10 pages.
USPTO Non-Final Rejection for U.S. Appl. No. 10/002,726 dated Dec. 13, 2004; 7 pages.
USPTO U.S. Appl. No. 11/818,005: "Techniques for Generating Microcontroller Configuration Information," Ogami et at., filed on Jun. 12, 2007; 61 pages.
USPTO Requirement for Restriction/Election for U.S. Appl. No. 11/818,005 dated Jul. 14, 2009; 5 pages.
USPTO Notice of Allowance for Application No. 11/986,338 dated May 7, 2009; 1 page.
International Search Report of the International Searching Authority for International Application No. PCT/US08/60880 mailed Aug. 15, 2008; 1 page.
The Written Opinion of the International Searching Authority for International Application No. PCT/US08/60680 mailed Aug. 15, 2008; 4 pages.
USPTO U.S. Appl. No. 11/088,028: "Method and Circuit for Rapid Alignment of Signals," Moyal et al., filed on Nov. 13, 2007; 34 pages.
USPTO Notice of Allowance for U.S. Appl. No. 11/088,028 dated Jul. 2, 2007; 6 pages.
USPTO Notice of Allowance for U.S. Appl. No. 11/088,028 dated Jan. 26, 2007; 6 pages.
USPTO Non-Final Rejection for U.S. Appl. No. 11/088,028 dated Jun. 16, 2006; 8 pages.
USPTO U.S. Appl. No. 11/985,340: "Method and Circuit for Rapid Alignment of Signals," Moyal et al., filed on Nov. 13, 2007; 34 pages.
USPTO Notice of Allowance for U.S. Appl. No. 11/985,340 dated Jun. 2, 2009; 7 pages.
USPTO Requirement for Restriction for U.S. Appl. No. 11/985,340 dated Mar. 16, 2009; 7 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/987,243 dated Sep. 17, 2009; 9 pages.
USPTO Non-Final Rejection for U.S. Appl. No. 11/967,240 dated Jun. 10, 2009; 7 pages.
USPTO Non-Final Rejection for U.S. Appl. No. 11/857,947 dated Mar. 30, 2009; 18 pages.
USPTO Non-Final Rejection for U.S. Appl. No. 121104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for International U.S. Appl. No. PCT/US08/60695 dated Jul. 22, 2009; 3 pages.
Written Opinion of the International Searching Authority for International U.S. Appl. No. PCT/US08160695 dated Jul. 22, 2009; 6 pages.
Azim et al., "A Custom DSP Chip to Implement a Robot Motion Controller Proceedings of the IEEE Custom Integrated Circuits Conference," May 1988, pp. 8.7.1-8.7.5; 6 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
International Search Report of the International Searching Authority for International U.S. Appl. No. PCT/US08/60696 dated Sep. 22, 2008; 2 pages.
International Search Report of the International Searching Authority for International U.S. Appl. No. PCT/US08/60698 dated Sep. 5, 2008; 2 pages.
Shahbahrami et al., "Matrix Register File and Extended Subwords: Two Techniques for Embedded Media Processors," ACM, May 2005; 9 pages.
Jung et al., "A Register File with Transposed Access Mode," 2000, IEEE; 2 pages.
International Search Report of the International Searching Authority for International U.S. Appl. No. PCT/US08/60681 dated Sep. 12, 2008; 2 pages.
Written Opinion of the International Searching Authority for International Application No. PCT/US08/60681 dated Sep. 12, 2008; 4 pages.
USPTO Notice of Allowance for U.S. Appl. No. 11/965,677 dated Sep. 10, 2009; 6 pages.
USPTO Non-Final Rejection for U.S. Appl. No. 11/965,677 dated Mar. 10, 2009; 10 pages.
Written Opinion of the International Searching Authority for International Application No. PCT/US08/60696 dated Sep. 22, 2008; 4 pages.
USPTO Notice of Allowance for U.S. Appl. No. 10/238,966 dated Aug. 5, 2009; 5 pages.
USPTO Notice of Allowance for U.S. Appl. No. 10/033,027 dated Sep. 2, 2009; 4 pages.
USPTO Non-Final Rejection for U.S. Appl. No. 10/001,478 dated Aug. 4, 2009; 17 pages.
USPTO Advisory Action for U.S. Appl. No. 10/001,478 dated Jun. 30, 2009; 3 pages.
USPTO Final Rejection for U.S. Appl. No. 10/001,478 dated Apr. 20, 2009; 16 pages.
USPTO Notice of Allowance for U.S. Appl. No. 10/002,217 dated Sep. 17, 2009; 6 pages.
USPTO Notice of Allowance for U.S. Appl. No. 10/002,217 dated Jun. 8, 2009; 8 pages.
USPTO Notice of Allowance for U.S. Appl. No. 10/001,477 dated Dec. 4, 2009; 7 pages.
USPTO Notice of Allowance for U.S. Appl. No. 10/001,477 dated Aug. 26, 2009; 6 pages.
USPTO Ex Parte Quayle Action for U.S. Appl. No. 09/975,115 dated Aug. 20, 2009; 7 pages.
USPTO Non-Final Rejection for U.S. Appl. No. 09/994,601 dated Jul. 9, 2009; 11 pages.
USPTO Non-Final Rejection for U.S. Appl. No. 11/818,005 dated Nov. 23, 2009; 8 pages.
USPTO Requirement for Restriction/Election for U.S. Appl. No. 11/818,005 dated Jul. 14, 2009; 5 pages.
USPTO Advisory Action for U.S. Appl. No. 09/989,778 dated Jun. 17, 2009; 3 pages.

USPTO Notice of Allowance for U.S. Appl. No. 09/994,600 dated Aug. 25, 2009; 4 pages.
USPTO Notice of Allowance for U.S. Appl. No. 09/994,600 dated Apr. 3, 2009; 5 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.
USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771 dated Nov. 25, 2009; 12 pages.
USPTO Notice of Allowance for U.S. Appl. No. 09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Notice of Allowance for U.S. Appl. No. 11/986,338 dated Oct. 19, 2009; 4 pages.
USPTO Notice of Allowance for U.S. Appl. No. 09/989,777 dated Aug. 6, 2009; 8 pages.
USPTO Notice of Allowance for U.S. Appl. No. 10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/850,260 dated Aug. 21, 2009; 9 pages.
USPTO Final Rejection for U.S. Appl. No. 09/989,767 dated Dec. 7, 2009; 22 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Notice of Allowance for U.S. Appl. No. 09/989,777 dated Jan. 15, 2010; 8 pages.
USPTO Non-Final Rejection for U.S. Appl. No. 10/133,581 dated Feb. 24, 2006; 11 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Notice of Allowance for U.S. Appl. No. 10/033,027 dated Feb. 18, 2010; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010; 7 pages.
USPTO Non-Final Rejection for U.S. Appl. No. 10/133,581 dated Aug. 12, 2005; 12 pages.
USPTO Notice of Allowance for U.S. Appl. No. 10/133,581 dated Mar. 5, 2010; 9 pages.
USPTO Non-Final Rejection for U.S. Appl. No. 10/133,581 dated Sep. 1, 2009; 18 pages.
USPTO Final Rejection for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated Nov. 27, 2007; 15 pages.
USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
USPTO Notice of Allowance for Application No. 10/001,477 dated Mar. 23, 2010; 6 pages.
USPTO Notice of Allowance for Application No. 09/989,765 dated Mar. 31, 2010; 8 pages.

* cited by examiner

UNIVERSAL DIGITAL BLOCK INTERCONNECTION AND CHANNEL ROUTING

The present application claims priority to Provisional Application No. 60/912,399, filed Apr. 17, 2007 and is herein incorporated by reference in its entirety.

TECHNICAL FIELD

The present disclosure relates generally to programmable devices, and more particularly to a programmable interconnect matrix.

BACKGROUND

Field-programmable gate arrays (FPGAs) and Programmable Logic Devices (PLDs) have been used in data communication and telecommunication systems. Conventional PLDs and FPGAs consist of an array of programmable elements, with the elements programmed to implement a fixed function or equation. Some currently-available Complex PLD (CPLD) products comprise arrays of logic cells. Conventional PLD devices have several drawbacks, such as limited speed and limited data processing capabilities.

In developing complex integrated circuits, there is often a need for additional peripheral units, such as operational and instrument amplifiers, filters, timers, digital logic circuits, analog to digital and digital to analog converters, etc. As a general rule, implementation of these extra peripherals create additional difficulties: extra space for new components, additional attention during production of a printed circuit board, and increased power consumption. All of these factors can significantly affect the price and development cycle of the project.

The introduction of the Programmable System on Chip (PSoC) features digital and analog programmable blocks, which allow the implementation of a large number of peripherals. A programmable interconnect allows analog and digital blocks to be combined to form a wide variety of functional modules. The digital blocks consist of smaller programmable blocks and are configured to provide different digital functions. The analog blocks are used for development of analog elements, such as analog filters, comparators, inverting amplifiers, as well as analog to digital and digital to analog converters. Current PSoC architectures provide only a coarse grained programmability where only a few fixed functions are available with only a small number of connection options.

SUMMARY

A programmable interconnect matrix includes horizontal channels that programmably couple different groups of one or more digital blocks together. The interconnect matrix can include segmentation elements that programmably interconnect different horizontal channels together. The segmentation elements can include horizontal segmentation switches that programmably couple together the horizontal channels for different groups of digital blocks in a same row. Vertical segmentation switches can programmably couple together the horizontal channels for different groups of digital blocks in different rows.

Vertical channels can programmably connect the horizontal channels in different rows. The horizontal channels provide more connectivity between the digital blocks located in the same rows than connectivity provided by the vertical channels connecting the digital blocks in different rows. Two digital blocks in a same digital block pair can be tightly coupled together to common routes in a same associated horizontal channel and different digital block pairs can be less tightly coupled together through the segmentation elements.

Programmable switches are configured to connect different selectable signals from the digital bocks to their associated horizontal channels. Programmable tri-state buffers in the segmentation elements can be configured to selectively couple together and drive signals between different horizontal channels.

A Random Access Memory (RAM) can be configured to programmably control how the different digital blocks are coupled together through the interconnection matrix. Undedicated Inputs and Outputs (I/Os) can be programmably coupled to different selectable signals in different selectable digital blocks through different selectable routes in the interconnection matrix. The undedicated Inputs and Outputs refer to the connections on the Integrated Circuit (IC) to external signals.

A micro-controller system is programmably coupled to the different digital blocks through the interconnect matrix and is programmably coupled to the different programmable Inputs/Outputs (I/Os) through the interconnect matrix. The micro-controller system can include a micro-controller, an interrupt controller, and Direct Memory Access (DMA) controller. Interrupt requests can be programmably coupled between the interrupt controller and different selectable digital blocks or different selectable I/Os through the interconnect matrix. DMA requests can also be programmably coupled between the DMA controller and different selectable digital blocks or different selectable I/Os through the interconnect matrix. In one embodiment, the micro-controller, digital blocks, I/Os, and interconnect are all located in a same integrated circuit.

In one embodiment, the digital blocks comprise a first group of uncommitted logic elements that are programmable into different logic functions and also include a second group of structural logic elements that together form a programmable arithmetic sequencer.

INTRODUCTION

A new programmable routing scheme provides improved connectivity both between Universal Digital Blocks (UDBs)

and between the UDBs and other micro-controller elements, peripherals and external Inputs and Outputs (I/Os) in the same Integrated Circuit (IC). The routing scheme increases the number of functions and the overall routing efficiency for programmable architectures. The UDBs can be grouped in pairs and share associated horizontal routing channels. Bidirectional horizontal and vertical segmentation elements extend routing both horizontally and vertically between different UDB pairs and to the other peripherals and I/O.

DETAILED DESCRIPTION

Figure 1:
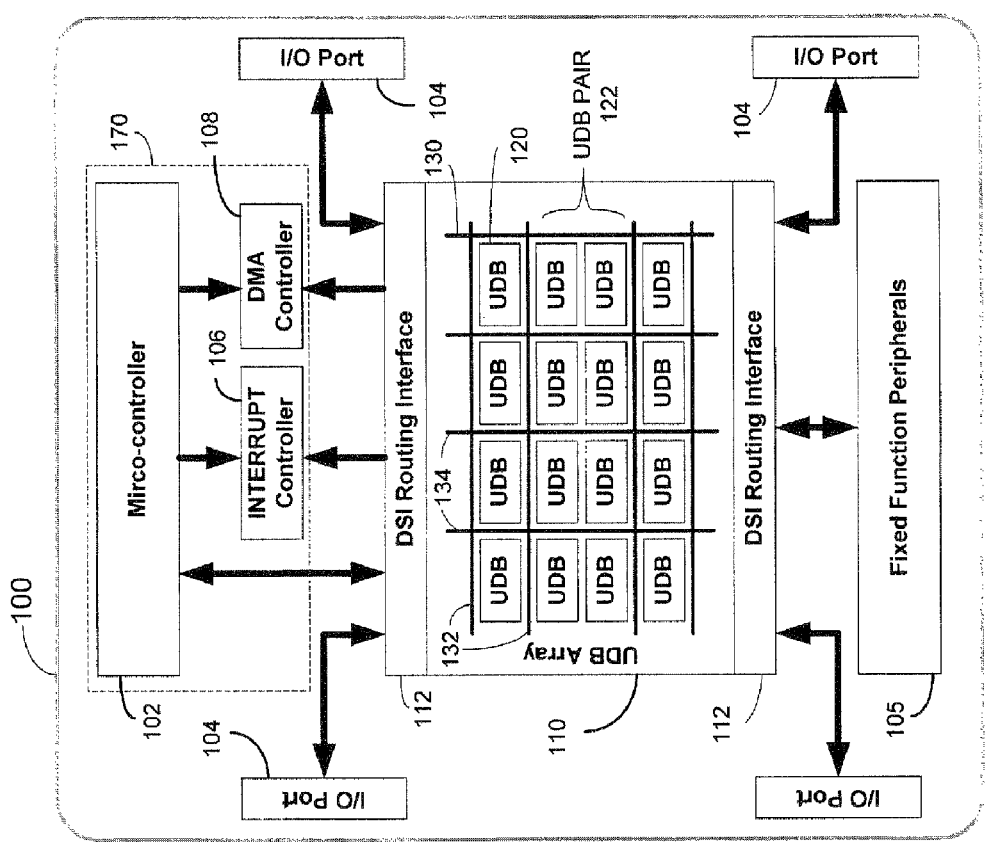
FIG. 1 is a schematic block diagram illustrating an example PSoC architecture that includes a Universal Digital Block (UDB) array.

FIG. 1 is a high level view of a Universal Digital Block (UDB) array 110 contained within a Programmable System on a Chip (PSoC) Integrated Circuit (IC) 100. The UDB array 110 includes a programmable interconnect matrix 130 that connects together the different UDBs 120. The individual UDBs 120 each include a collection of uncommitted logic in the form of Programmable Logic Devices (PLDs) and structural dedicated logic elements that form a datapath 210 shown in more detail in FIGS. 8 and 9.

UDB Array

The UDB array 110 is arranged into UDB pairs 122 that each include two UDBs 120 that can be tightly coupled to a shared horizontal routing channel 132. The UDB pairs 122 can also be programmably connected to the horizontal routing channels 132 of other UDB pairs 122 either in the same horizontal row or in different rows through vertical routing channels 134. The horizontal and vertical routing channels and other switching elements are all collectively referred to as the interconnect matrix 130.

A Digital System Interconnect (DSI) routing interface 112 connects a micro-controller system 170 and other fixed function peripherals 105 to the UDB array 110. The micro-controller system 170 includes a micro-controller 102, an interrupt controller 106, and a Direct Memory Access (DMA) controller 108. The other peripherals 105 can be any digital or analog functional element in PSoC 100. The DSI 112 is an extension of the interconnect matrix 130 at the top and bottom of the UDB array 110.

Figure 2:
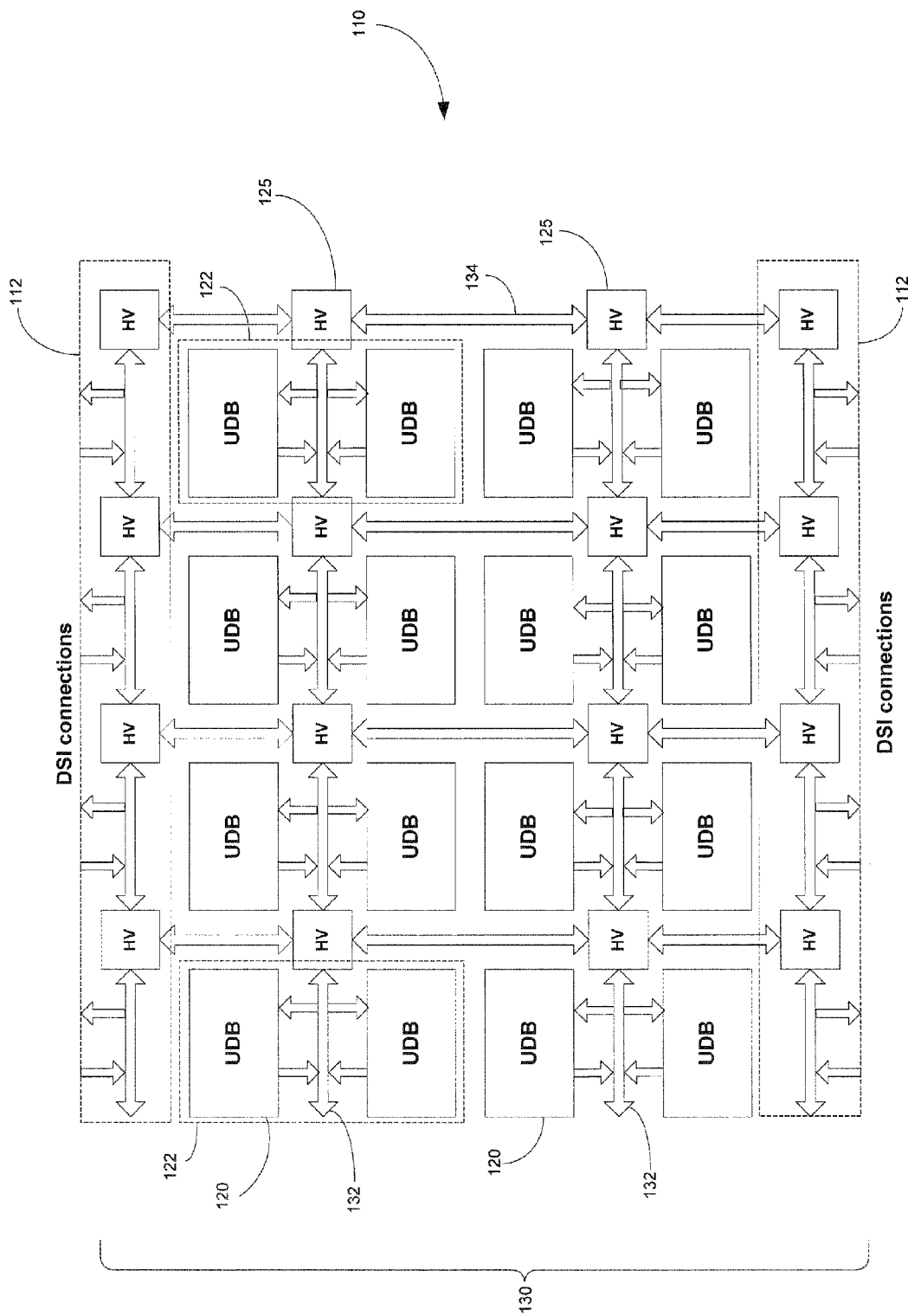
FIG. 2 is a schematic block showing an interconnect matrix in the UDB array.

FIG. 2 shows the interconnect matrix 130 in more detail and includes horizontal routing channels 132 that programmably connect with one or more associated Universal Digital Blocks (UDB) 120. In this example, pairs 122 of UDBs 120 are tightly coupled together through their associated horizontal routing channel 132. However, more than two UDBs 120 can be tightly coupled together through the same horizontal routing channel 132.

The interconnect matrix 130 also includes Horizontal/Vertical (H/V) segmentation elements 125 that programmably interconnect the different horizontal routing channels 132 together. The segmentation elements 125 couple together the horizontal routing channels 132 for the different digital block pairs 122 in the same rows. The segmentation elements 125 also programmably couple together the horizontal routing channels 132 for digital block pairs 122 in different rows through vertical routing channels 134.

Figure 3:
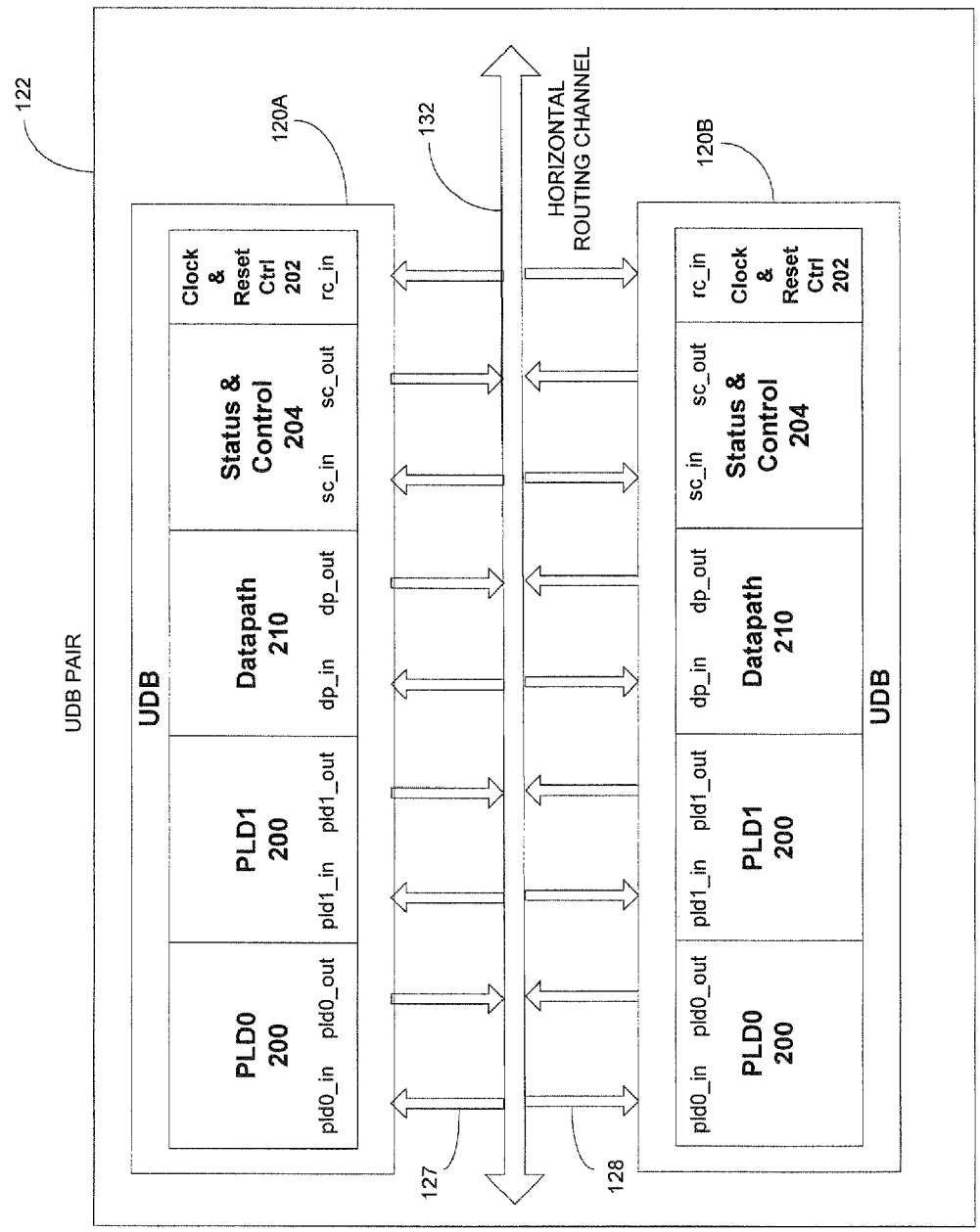
FIG. 3 is a schematic block diagram showing how a pair of UDBs are tightly coupled to a horizontal routing channel.

FIG. 3 shows one of the UDB pairs 122 in more detail. The UDBs 120A and 120B each contain several different functional blocks that in one embodiment include two Programmable Logic Devices (PLDs) 200, a data path 210, status and control 204, and clock and reset control 202. The operations of these different functional elements are described in more detail below in FIGS. 8 and 9.

The two UDBs 120A and 120B in UDB pair 122 are tightly coupled together to common routes in the same associated horizontal routing channel 132. Tight coupling refers to the UDB I/O signals 127 in the upper UDB 120A and the corresponding signals 128 in the lower UDB 120B all being directly connected to the same associated horizontal routing channel 132. This tight coupling provides high performance signaling between the two UDBs 120A and 120B. For example, relatively short connections 127 and 128 can be programmably established between the upper UDB 120A and the lower UDB 120B.

In one embodiment, the horizontal routing channels 132 can also have a larger number of routes and connections to the UDBs 120A and 120B than the vertical routing channels 134 shown in FIG. 2. This allows the horizontal routing channels 132 to provide more interconnectivity both between the UDBs 120A and 120B in UDB pair 122 and also provides more interconnectivity between different UDB pairs 122 in the same rows of interconnect matrix 130.

Thus, the interconnect matrix 130 in FIGS. 1 and 2 more effectively uses chip space by providing more traces and connectivity for the shorter/higher performance horizontal routing channels 132 than the relatively longer/lower performance vertical routing channels 134.

Figure 4:
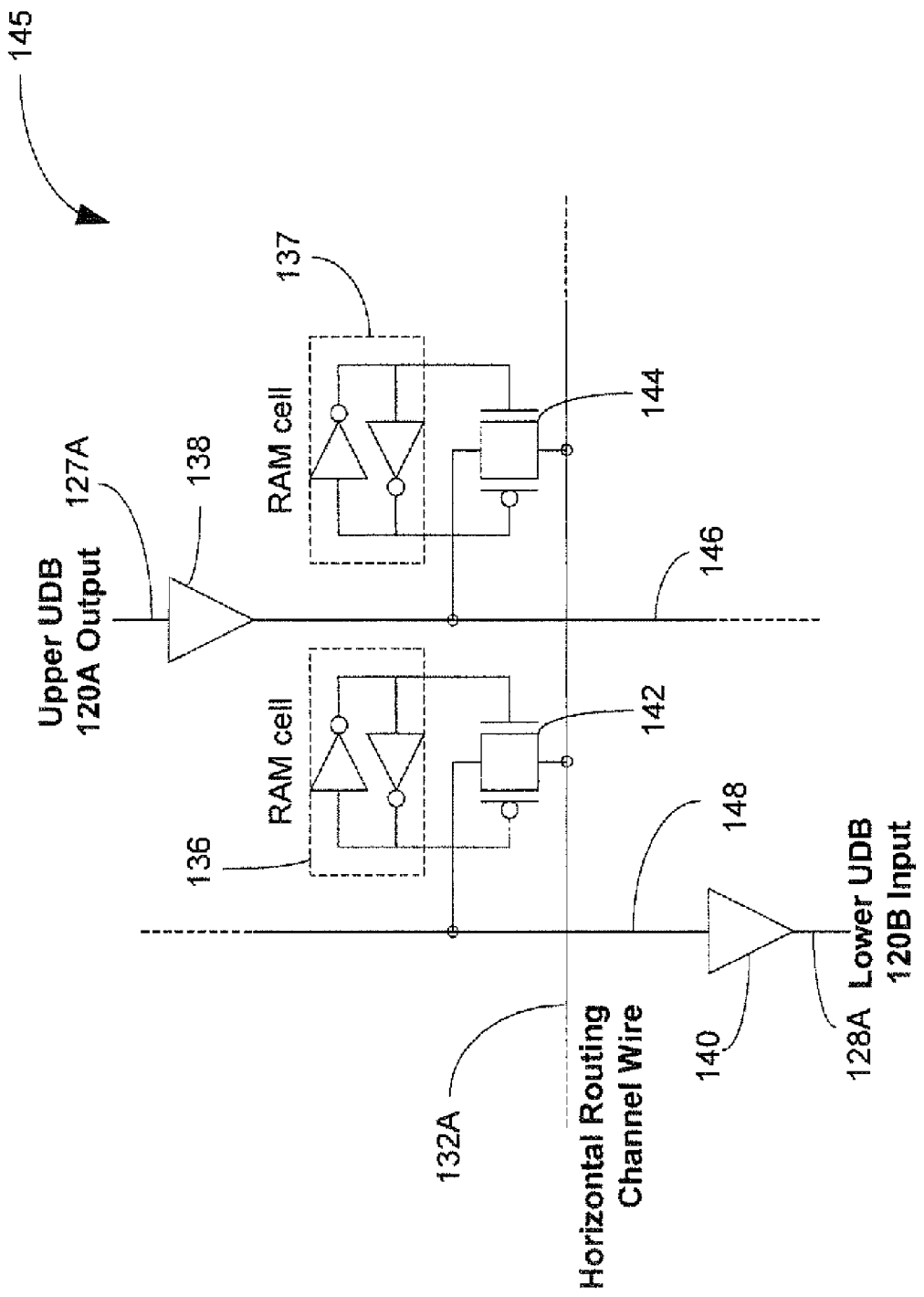
FIG. 4 is a schematic block diagram showing programmable switches that connect the UDBs in FIG. 3 to the horizontal routing channel.

FIG. 4 shows switching elements 145 that connect the different I/O signals 127 and 128 for the UDBs 120A and 120B in FIG. 3 to the horizontal routing channel 132. In this example, an output 127A from the upper UDB 120A in the UDB pair 122 drives an input 128A in the lower UDB 120B. A buffer 138 is connected to the UDB output 127A and a buffer 140 is connected to the UDB input 128A. The output 127A and input 128A are connected to vertical wires 146 and 148, respectively, that intersect the horizontal routing channel wire 132A with a regular pattern.

At the switch points, RAM bits operate RAM cells 136 and 138 which in turn control Complementary Metal Oxide Semiconductor (CMOS) transmission gate switches 142 and 144, respectively. The switches 142 and 144 when activated connect the UDB output 127A and the UDB input 128A to horizontal routing channel wire 132A.

Figure 7:
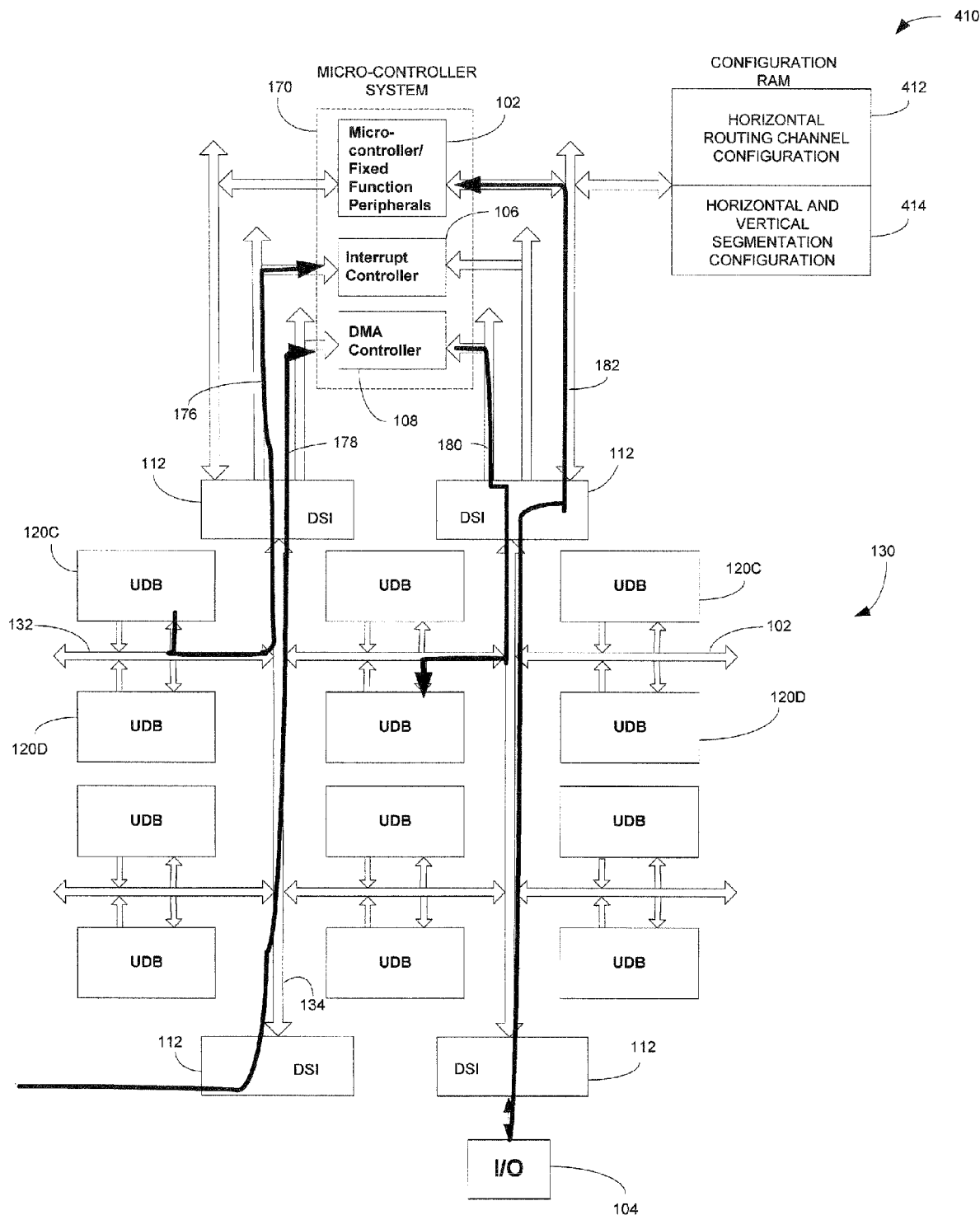
FIG. 7 is a schematic block diagram that shows how the interconnect matrix of FIG. 2 can connect different interconnect paths to a micro-controller system.

The RAM cells 136 and 137 are programmably selectable by the micro-controller 102 (FIG. 1) by writing values into a configuration RAM 410 (FIG. 7). This allows the micro-controller 102 to selectively activate or deactivate any of the gate switches 142 and 144 and connect any I/O 127 or 128 from either of the two universal digital blocks 120A and 120B to different wires in the horizontal channel 132.

Figure 5:
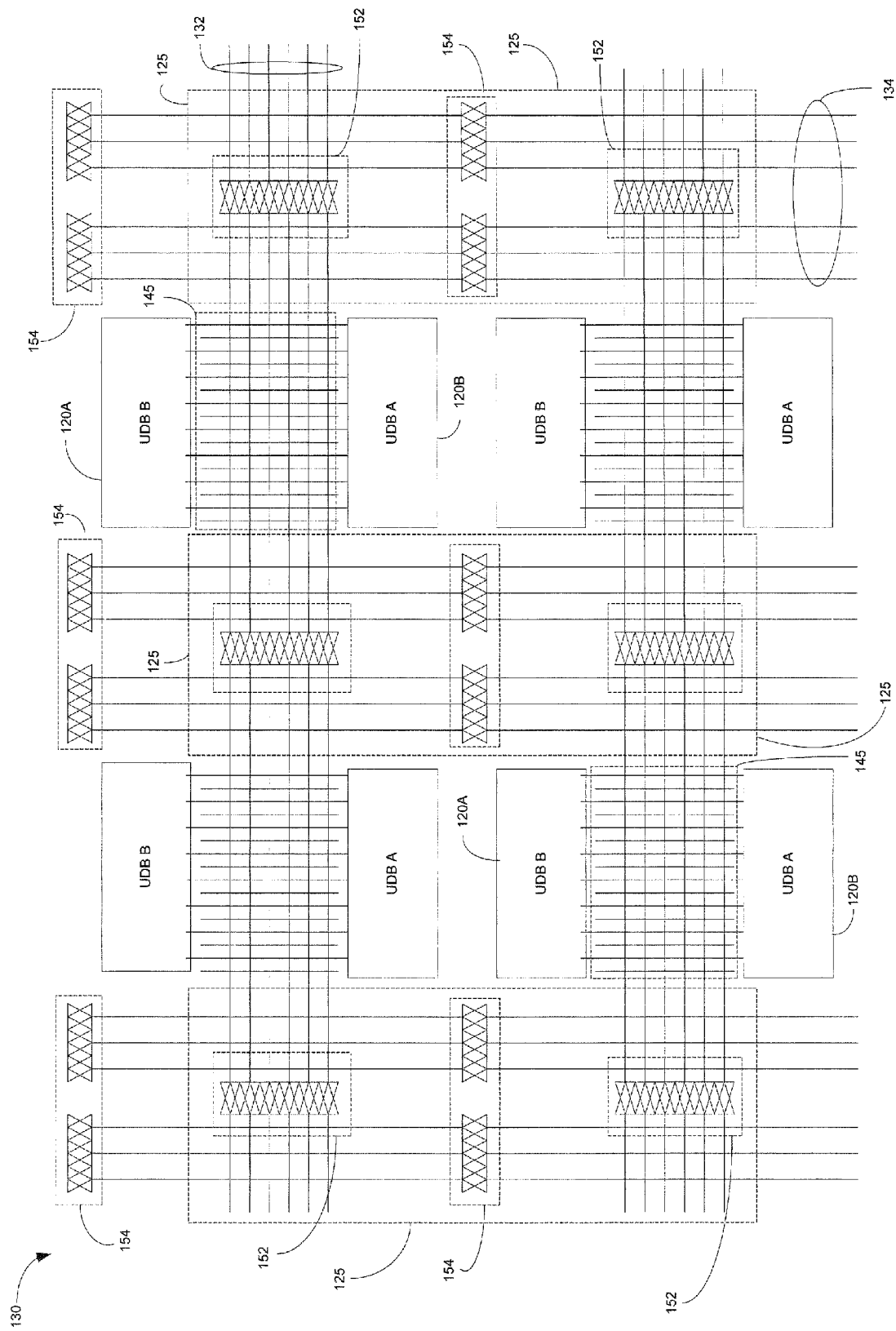
FIG. 5 is a schematic block diagram showing segmentation elements in the interconnect matrix.

FIG. 5 shows the interconnect matrix 130 previously shown in FIGS. 1 and 2 in further detail. The segmentation elements 125 can include different combinations of horizontal segmentation switches 152 and vertical segmentation switches 154. The horizontal segmentation switches 152 programmably couple together adjacent horizontal routing channels 132 located in the same row. The vertical segmentation switches 152 programmably couple together horizontal routing channels 132 located vertically in adjacent rows via vertical routing channels 134.

In addition to the segmentation elements 125, the interconnect matrix 130 includes the switching elements 145 previously shown in FIG. 4 that programmably connect the upper and lower UDBs 120A and 120B with their associated horizontal routing channels 132.

Figure 6:
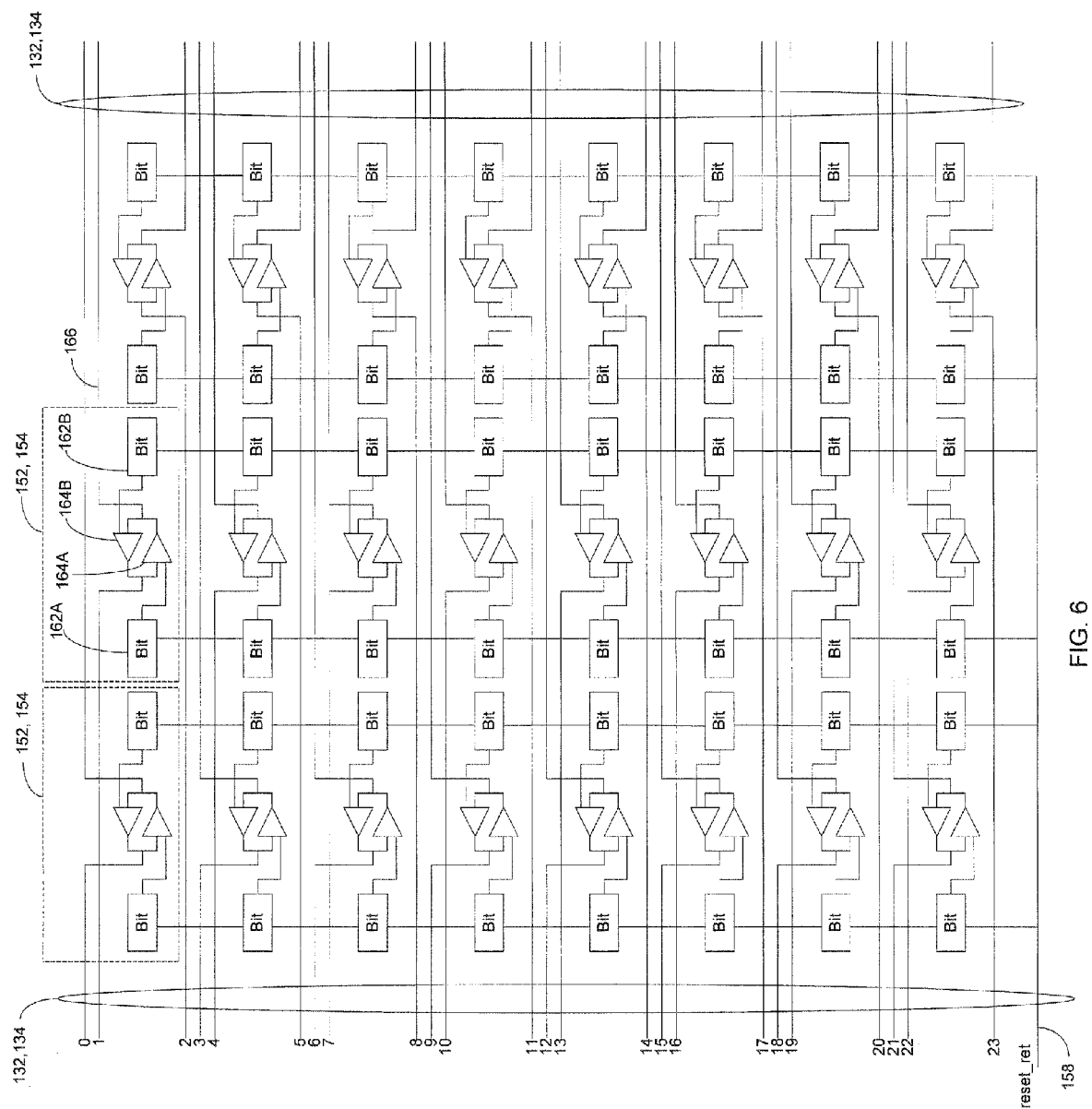
FIG. 6 is a schematic block diagram showing different programmable switches in the segmentation elements of FIG. 5 in more detail.

Referring to FIGS. 5 and 6, the segmentation elements 125 comprise arrays of horizontal segmentation switches 152 that are coupled in-between different horizontal routing channels 132 and vertical segmentation switches 154 coupled in-between the vertical routing channels 134. Each segmentation switch 152 and 154 is controlled by two bits 162A and 162B from the configuration RAM 410 (FIG. 7). The two bits 162A and 162B together control a tri-state buffer 164.

When bit 162A is set, the buffer 164A drives one of the horizontal or vertical channel lines 166 from left to right. When bit 162B is set, the buffer 164B drives the same horizontal or vertical channel line 166 from right to left. If neither bit 162A or bit 162B is set, the buffers 164A and 164B drive line 166 to a high impedance state.

Configuration and Programmability

Any combination of the switching elements 145, horizontal segmentation switches 152, and vertical segmentation switches 154 can be programmably configured to connect together almost any combination of external I/O pins 104 (FIG. 1), UDBs 120, and micro-controller system elements 170, fixed peripherals 105, and UDBs 120 (FIG. 1).

FIG. 7 shows different examples of how different types of interconnect paths can be programmed through the interconnect matrix 130. A Random Access Memory (RAM) or a set of configuration registers 410 are directly readable and writeable by the micro-controller 102. The configuration registers 410 are shown as a stand-alone RAM in FIG. 7 for illustrative purposes. However, it should be understood that certain configuration registers 410 can be located within the individual UDBs 120 while other configuration registers can be stand-alone registers that are accessed by multiple different functional elements.

A first set of bits in RAM section 412 are associated with the RAM cells 136 and 137 shown in FIG. 4 that control connections between the inputs and output of UDB and their associated horizontal routing channels 132. A second set of bits in RAM section 414 control how the horizontal segmentation switches 152 in FIGS. 5 and 6 connect the horizontal routing channels 132 in the same rows together and other bits in RAM section 414 control how the vertical segmentation switches 154 connect together the horizontal routing channels 132 in different rows.

Pursuant to the micro-controller 102 programming RAM 410, the interconnect matrix 130 is configured with a first interconnect path 176 that connects a UDB 120C to the interrupt controller 106. The UDB 120C can then send interrupt requests to the DMA controller 108 over interconnect path 176. A second interconnect path 178 is established between a peripheral (not shown) in the PSoC chip 100 (FIG. 1) and the DMA controller 108. The peripheral sends DMA requests to the DMA controller 108 over the interconnect path 178 established over the interconnect matrix 130.

A third interconnect path 180 is also configured by the micro-controller 102 by loading bits into RAM sections 412 and 414. The DMA controller 108 uses the interconnect path 180 to send a DMA terminate signal to UDB 120D. A fourth interconnect path 182 is programmably configured between one of the PSoC I/O pins 104 and a fixed digital peripheral, such as the micro-controller 102. The interconnect path 182 is used to send I/O signals between the micro-controller 102 and the I/O pin 104.

Interconnect paths 176-182 are of course just a few examples of the many different interconnect configurations that can be simultaneously provided by the interconnect matrix 130. This example also shows how different I/O pins 104, UDBs 120, and other peripherals can be connected to the same interrupt line on the interrupt controller 106 or connected to the same DMA line on the DMA controller 108.

Typically, interrupt requests received by an interrupt controller and DMA requests received by a DMA controller can only be connected to one dedicated pin. The interconnect matrix 130 allows any variety of different selectable functional elements or I/O pins to be connected to the same input or output for the interrupt controller 106 or DMA controller 108 according to the programming of RAM 410 by micro-controller 102.

The programmability of the interconnect matrix 130 also allows any number, or all, of the I/O pins 104 to be undedicated and completely programmable to connect to any functional element in PSoC 100. For example, the pin 104 can operate as an input pin for any selectable functional element in FIG. 7. In another interconnect matrix configuration, the same pin 104 can operate as an output pin when connected to a first peripheral and operate as an output pin when connected to a different peripheral.

Universal Digital Block

Figure 8:
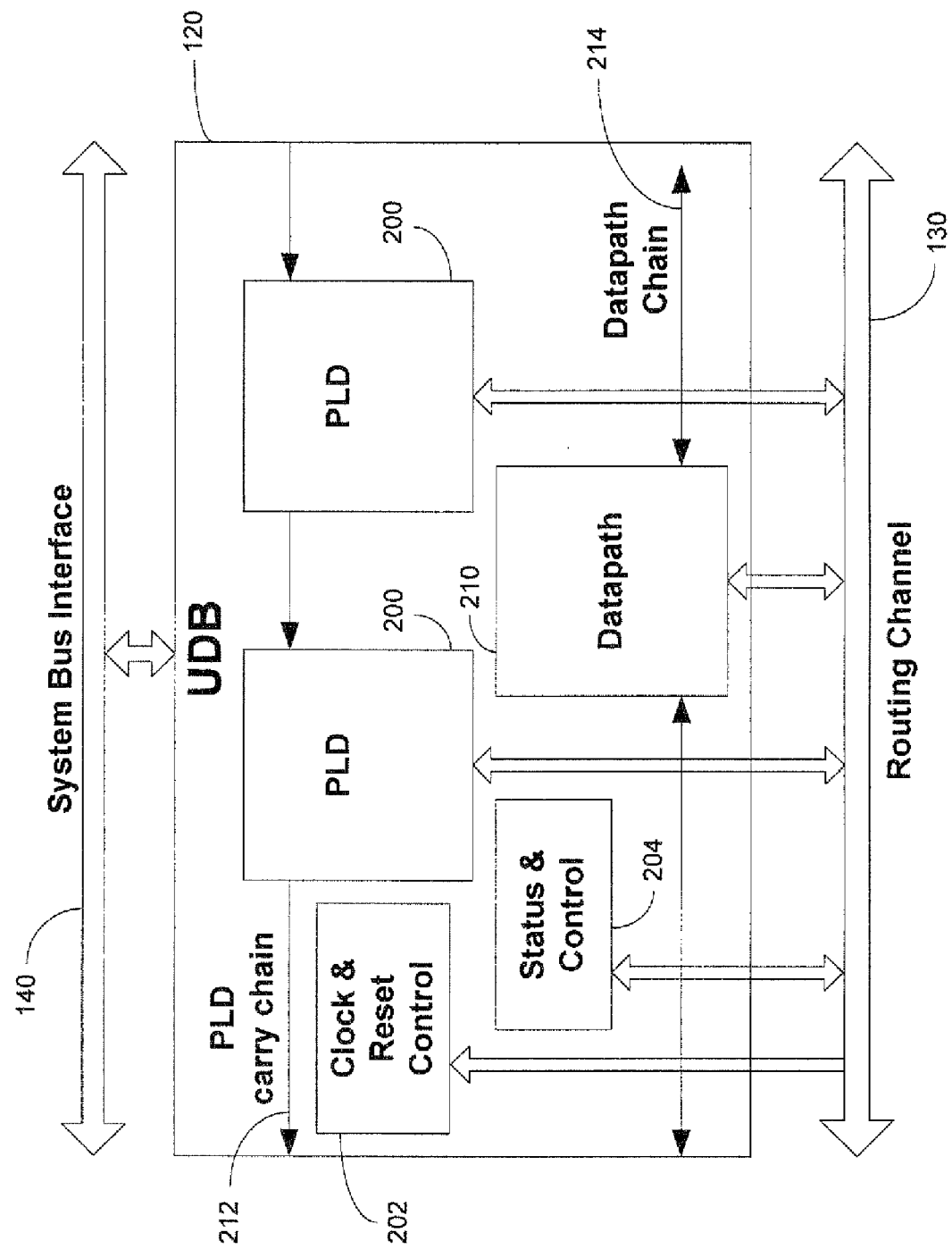
FIG. 8 is a schematic diagram that shows one of the UDBs in more detail.

FIG. 8 is a top-level block diagram for one of the UDBs 120. The major blocks include a pair of Programmable Logic Devices (PLDs) 200. The PLDs 200 take inputs from the routing channel 130 and form registered or combinational sum-of-products logic to implement state machines, control for datapath operations, conditioning inputs and driving outputs.

The PLD blocks 200 implement state machines, perform input or output data conditioning, and create look-up tables. The PLDs 200 can also be configured to perform arithmetic functions, sequence datapath 210, and generate status. PLDs are generally known to those skilled in the art and are therefore not described in further detail.

The datapath block 210 contains highly structured dedicated logic that implements a dynamically programmable ALU, comparators, and condition generation. A status and control block 204 allows micro-controller firmware to interact and synchronize with the UDB 120 by writing to control inputs and reading status outputs.

A clock and reset control block 202 provides global clock selection, enabling, and reset selection. The clock and reset block 202 selects a clock for each of the PLD blocks 200, the datapath block 210, and status and control block 204 from available global system clocks or a bus clock. The clock and reset block 202 also supplies dynamic and firmware resets to the UDBs 120.

Routing channel 130 connects to UDB I/O through a programmable switch matrix and provides connections between the different UDBs in FIG. 7. A system bus interface 140 maps all registers and RAMs in the UDBs 120 into a system address space and are accessible by the micro-controller 102.

The PLDs 200 and the datapath 210 have chaining signals 212 and 214, respectively, that enable neighboring UDBs 120 to be linked to create higher precision functions. The PLD carry chain signals 212 are routed from the previous adjacent UDB 120 in the chain, and routed through each macrocell in both of the PLDs 200. The carry out is then routed to the next UDB 120 in the chain. A similar connectivity is provided by the datapath chain 214 between datapath blocks 210 in adjacent UDBs 120.

Figure 9:
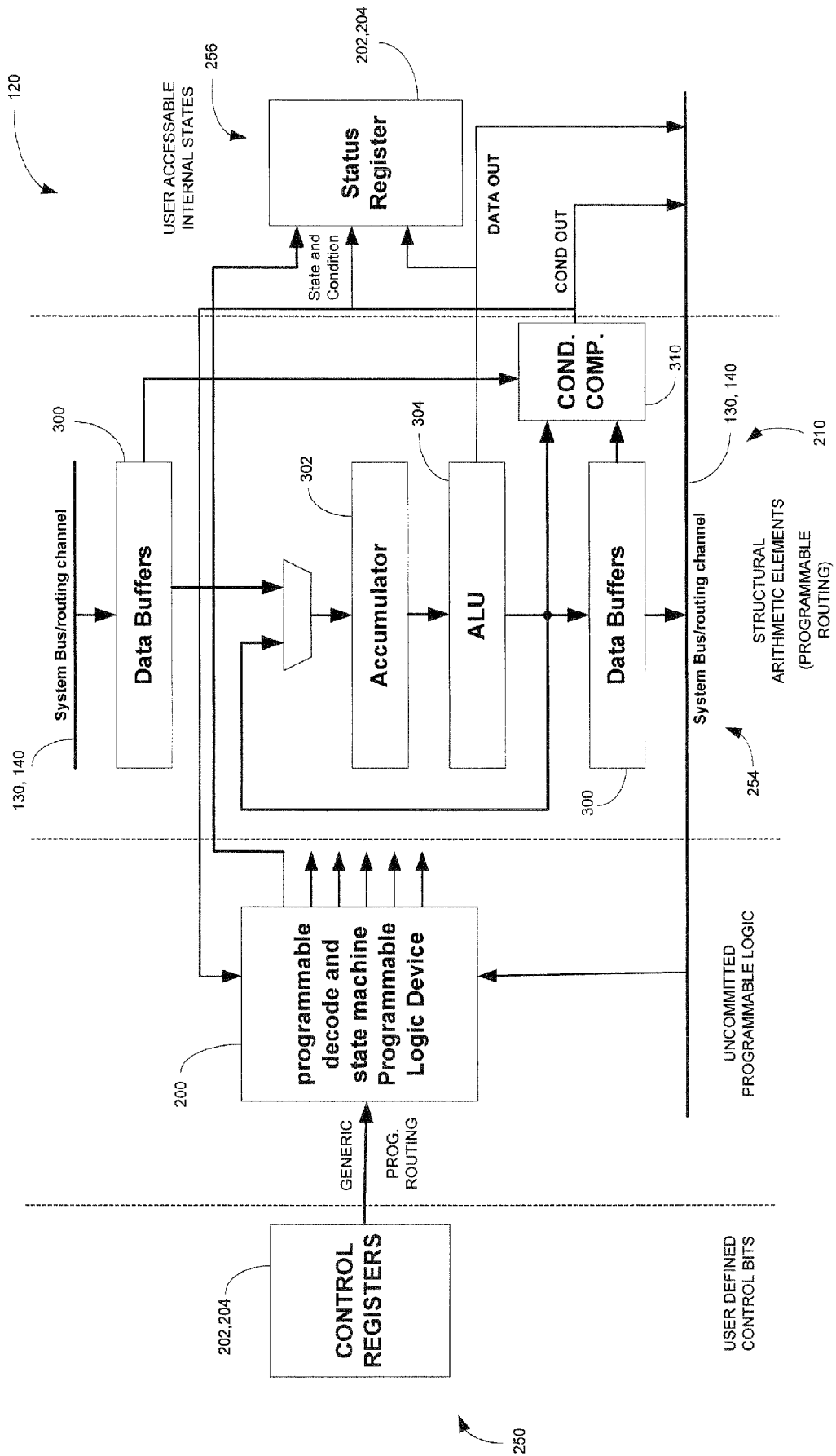
FIG. 9 is a schematic diagram that shows a datapath in the UDB of FIG. 8 in more detail.

Referring to FIG. 9, each UDB 120 comprises a combination of user defined control bits that are loaded by the micro-controller 102 into control registers 250. The control registers 250 can be part of the control blocks 202 and 204 described above in FIG. 8. The control registers 250 feed uncommitted programmable logic 200. The same control blocks 202 and 204 described above in FIG. 8 also include associated status registers 256 that allow the micro-controller 102 to selectably read different internal states for structural arithmetic elements 254 within the datapath 210.

The datapath 210 comprises highly structured logic elements 254 that include a dynamically programmable ALU 304, conditional comparators 310, accumulators 302, and data buffers 300. The ALU 304 is configured to perform instructions on accumulators 302, and to update the sequence controlled by a sequence memory. The conditional comparators 310 can operate in parallel with the ALU 304. The datapath 210 is further optimized to implement typical embedded functions, such as timers, counters, etc.

The combination of uncommitted PLDs 200 with a dedicated datapath module 210 allow the UDBs 120 to provide embedded digital functions with more efficient higher speed processing. The dedicated structural arithmetic elements 254 more efficiently implement arithmetic sequencer operations, as well as other datapath functions. Since the datapath 210 is structural, fewer gates are needed to implement the structural elements 254 and fewer interconnections are needed to connect the structural elements 254 together into an arithmetic sequencer. Implementing the same datapath 210 with PLDs could require additional combinational logic and additional interconnections.

The structured logic in the datapath 210 is also highly programmable to provide a wide variety of different dynamically selectable arithmetic functions. Thus, the datapath 210 not only conserves space on the integrated circuit 100 (FIG. 1) but also is more accessible and programmable than other structured arithmetic sequencers.

The functional configurability of the datapath 210 is provided through the control registers 250 and allow the micro-controller 102 to arbitrarily write into a system state and selectively control different arithmetic functions. The status registers 256 allow the micro-controller 102 to also identify different states associated with different configured arithmetic operations.

The flexible connectivity scheme provided by the routing channel 130 selectively interconnects the different functional element 250, 200, 254, and 256 together as well as programmably connecting these functional element to other UDBs, I/O connections, and peripherals. Thus, the combination of uncommitted logic 200, structural logic 254, and programmable routing channel 130 provides more functionality, flexibility, and more efficiently uses less integrated circuit space.

The interconnect matrix 130 also requires little or no dedicated UDB block routing. All data, state, control, signaling, etc, can be routed through the interconnect matrix 130 in the UDB array 110. The array routing is efficient because there is little or no difference between a local UDB net and a net that spans the UDB array. Horizontal and vertical segmentation allow the array to be partitioned for increased efficiency and random access to the RAM 410 allow high speed configuration or on the fly reconfigurability.

The system described above can use dedicated processor systems, micro controllers, programmable logic devices, or microprocessors that perform some or all of the operations. Some of the operations described above can be implemented in software and other operations can be implemented in hardware.

For the sake of convenience, the operations are described as various interconnected functional blocks or distinct software modules. This is not necessary, however, and there can be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

Having described and illustrated the principles of the invention in a preferred embodiment thereof, it should be apparent that the invention can be modified in arrangement and detail without departing from such principles. Claim is made to all modifications and variation coming within the spirit and scope of the following claims.

The invention claimed is:

1. An apparatus, comprising:
 an array of digital blocks; and
 a programmable interconnect matrix including horizontal channels that programmably couple different groups of one or more digital blocks together and segmentation elements that programmably interconnect different horizontal channels together, wherein the digital blocks each comprise a first group of uncommitted logic elements that are programmable into different logic functions and a second group of dedicated logic elements that together form a programmable arithmetic sequencer.

2. The apparatus according to claim 1 wherein the segmentation elements include:
 horizontal segmentation switches that programmably couple together the horizontal channels in a same row; and
 vertical segmentation switches that programmably couple together the horizontal channels in different rows.

3. An apparatus, comprising:
 an array of digital blocks;
 a programmable interconnect matrix including horizontal channels that programmably couple different groups of one or more digital blocks together and segmentation elements that programmably interconnect different horizontal channels together; and
 vertical channels that programmably interconnect the horizontal channels in different rows, wherein the horizontal channels provide more connectivity between the digital blocks located in the same rows than connectivity provided by the vertical channels between the digital blocks located in different rows.

4. An apparatus, comprising:
 an array of digital blocks; and
 a programmable interconnect matrix including horizontal channels that programmably couple different groups of one or more digital blocks together and segmentation elements that programmably interconnect different horizontal channels together,
 wherein two digital blocks in a same digital block pair are tightly coupled together to common routes in a same associated horizontal channel and different digital block pairs are less tightly coupled together through the segmentation elements.

5. The apparatus according to claim 1 further comprising:
 programmably selectable channel switches configured to connect different selectable signals from the digital bocks to associated horizontal channels; and
 programmable tri-state buffers in the segmentation elements configured to selectively couple together and drive signals between the different horizontal channels.

6. The apparatus according to claim 1 further comprising a Random Access Memory (RAM) configured to programmably control how the different digital blocks are coupled together through the interconnection matrix.

7. The apparatus according to claim 1 including Inputs and Outputs (I/Os) that are initially not dedicated to any particular digital blocks and that are programmably coupled to different selectable digital blocks through different selectable routes in the interconnect matrix.

8. An apparatus, comprising:
 an array of digital blocks; and
 a programmable interconnect matrix including horizontal channels that programmably couple different groups of one or more digital blocks together and segmentation elements that programmably interconnect different horizontal channels together; and a micro-controller system programmably coupled to the different digital blocks and to different selectable Inputs/Outputs (I/Os) through the interconnect matrix.

9. The apparatus according to claim 8 wherein:

the micro-controller system includes a micro-controller, an interrupt controller, and Direct Memory Access (DMA) controller;

interrupt requests are programmably coupled between the interrupt controller and different selectable digital blocks or different selectable I/Os through the interconnect matrix; and DMA requests are programmably coupled between the DMA controller and different selectable digital blocks or different selectable I/Os through the interconnect matrix.

10. The apparatus according to claim 9 wherein the micro-controller system, digital blocks, I/Os, and interconnect matrix are all located in a same integrated circuit.

11. An integrated circuit, comprising:

a micro-controller system;

a programmable interconnect including horizontal channels and vertical channels;

a memory device accessible by the micro-controller to control how functional elements in the integrated circuit connect to the horizontal channels and control how the horizontal channels and vertical channels connect to each other;

programmably configurable digital blocks that are selectively coupled to the horizontal channels according to bits loaded into the memory device; and undedicated external input and output pins that are programmably coupled to different inputs and outputs in the micro-controller system through the programmable interconnect and also programmably coupled to different selectable functional elements in the different digital blocks through the programmable interconnect.

12. The integrated circuit according to claim 11 further comprising segmentation elements having:

horizontal segmentation switches that programmably couple together the horizontal channels in a same row; and vertical segmentation switches that programmably couple together the horizontal channels in different rows.

13. The integrated circuit according to claim 11 further comprising:

channel switching elements that are programmably activated by a first set of memory cells in the memory device for connecting the horizontal channels to the digital blocks; and programmable tri-state buffers that are programmably activated by a second set of memory cells in the memory device for connecting together the horizontal channels.

14. An integrated circuit, comprising:

a micro-controller system;

a programmable interconnect including horizontal channels and vertical channels; and a memory device accessible by the micro-controller to control how functional elements in the integrated circuit connect to the horizontal channels and control how the horizontal channels and vertical channels connect to each other;

an interrupt controller that receives interrupt requests through the programmable interconnect from different selectable digital blocks or different selectable I/Os; and a Direct Memory Access (DMA) controller that receives DMA requests through the programmable interconnect from different selectable digital blocks or different selectable I/Os.

15. A method, comprising:

providing an interconnect matrix;

programming the interconnect matrix to connect different functional elements to associated local routing channels;

programming the interconnect matrix to interconnect different local routing channels together;

programming the interconnect matrix to further connect different local routing channels to each other through general routing channels;

writing a first set of values into a configuration memory that control connections between the functional elements and the associated local routing channels;

writing a second set of values into the configuration memory that control the interconnections between different local routing channels; and writing a third set of values into the configuration memory that control the interconnections between the local routing channels and the general routing channels.

16. A method, comprising:

providing an interconnect matrix;

programming the interconnect matrix to connect different functional elements to associated local routing channels;

programming the interconnect matrix to interconnect different local routing channels together;

programming the interconnect matrix to further connect different local routing channels to each other through general routing channels; and programming different paths through the interconnect matrix that connect different external pins or different internal functional elements to a same interrupt line on an internal interrupt controller; or programming different paths through the interconnect matrix that connect different external pins or different internal functional elements to a same Direct Memory Access (DMA) line on an internal DMA controller.

* * * * *

UNITED STATES PATENT AND TRADEMARK OFFICE
CERTIFICATE OF CORRECTION

| | | |
|---|---|---|
| PATENT NO. | : 7,737,724 B2 | Page 1 of 1 |
| APPLICATION NO. | : 11/965291 | |
| DATED | : June 15, 2010 | |
| INVENTOR(S) | : Warren Snyder, Bert Sullam and Haneef Mohammed | |

It is certified that error appears in the above-identified patent and that said Letters Patent is hereby corrected as shown below:

<u>Column 8</u>
Claim 5, line 51, delete "bocks" and substitute --blocks-- in its place.

Signed and Sealed this
Twenty-sixth Day of July, 2011

David J. Kappos
*Director of the United States Patent and Trademark Office*